(12) United States Patent
Behrens et al.

(10) Patent No.: US 7,715,207 B2
(45) Date of Patent: May 11, 2010

(54) RACK ARCHITECTURE AND MANAGEMENT SYSTEM

(75) Inventors: Edward Behrens, Laguna Niguel, CA (US); Tho Tu, Laguna Niguel, CA (US); Van T. Hua, San Jose, CA (US); David Wang, San Jose, CA (US)

(73) Assignee: Epicenter, Inc., San Clemente, CA (US)

( * ) Notice: Subject to any disclaimer, the term of this patent is extended or adjusted under 35 U.S.C. 154(b) by 306 days.

(21) Appl. No.: 11/844,304

(22) Filed: Aug. 23, 2007

(65) Prior Publication Data

US 2008/0030947 A1    Feb. 7, 2008

Related U.S. Application Data

(60) Continuation of application No. 11/564,151, filed on Nov. 28, 2006, now Pat. No. 7,551,456, which is a division of application No. 10/783,687, filed on Feb. 20, 2004, now Pat. No. 7,289,334.

(51) Int. Cl.
*H01R 12/16* (2006.01)

(52) U.S. Cl. .................................. 361/788; 361/803

(58) Field of Classification Search ................ 361/788, 361/801–803, 807, 810
See application file for complete search history.

(56) References Cited

U.S. PATENT DOCUMENTS

| | | | |
|---|---|---|---|
| 4,654,820 A | 3/1987 | Brahm et al. | |
| 4,970,726 A | 11/1990 | Carn et al. | |
| 5,913,034 A * | 6/1999 | Malcolm | 709/223 |
| 6,018,456 A | 1/2000 | Young et al. | |
| 6,201,692 B1 | 3/2001 | Gamble et al. | |
| 6,272,573 B1 | 8/2001 | Coale et al. | |
| 6,672,896 B1 * | 1/2004 | Li | 439/502 |
| 6,678,284 B1 * | 1/2004 | Verthein et al. | 370/465 |
| 6,718,274 B2 | 4/2004 | Huang et al. | |
| 6,843,674 B1 * | 1/2005 | Young | 439/248 |
| 7,551,456 B2 * | 6/2009 | Behrens et al. | 361/788 |
| 2002/0184398 A1 | 12/2002 | Orenshteyn | |
| 2002/0194412 A1 | 12/2002 | Bottom | |
| 2004/0059856 A1 | 3/2004 | Chan et al. | |

\* cited by examiner

*Primary Examiner*—Hung S Bui
(74) *Attorney, Agent, or Firm*—Snell & Wilmer L.L.P.

(57) ABSTRACT

One embodiment of the invention provides a fully distributed, scaleable and modular rack architecture and management system. One feature of the invention provides device management throughout the rack system with a vertical interface column integrated into the rack cabinet. Within each rack unit (U) of the vertical interface column, the vertical interface column may deliver connectivity to a device housed within the rack cabinet thereby eliminating runs of cable typically necessary for management of such devices. The vertical interface column can be expanded as necessary to provide connectivity to more devices using hot-swappable interface modules. A rack management system allows both local and remote management access to all devices mounted in the rack cabinet and coupled to the vertical interface column. The rack management system may also access to devices mounted in other rack cabinets.

25 Claims, 18 Drawing Sheets

RACK ARCHITECTURE AND MANAGEMENT SYSTEM

CROSS REFERENCE TO RELATED APPLICATION

This U.S. patent application is a continuation of U.S. patent application Ser. No. 11/564,151, filed on Nov. 28, 2006, which is a divisional of U.S. patent application Ser. No. 10/783,687, filed on Feb. 20, 2004, which claims the benefit of U.S. Provisional Application No. 60/498,193, filed on Aug. 27, 2003 by inventors Edward Behrens, Tho Tu, Van T. Hua, and David Wang, all of which are hereby incorporated by reference herein.

FIELD OF THE INVENTION

Various embodiments of the invention pertain to rack enclosure cabinets for computer and other electrical devices. More particularly, at least one embodiment of the invention relates to a rack architecture with a interface column to reduce cabling in the rack cabinet as well as centralize system management to efficiently monitor and control devices in the rack cabinet.

DESCRIPTION OF THE RELATED ART

Rack enclosure cabinets have been used to house a plurality of computers and other devices. Such rack cabinets provide a way to house a number of computers and/or other devices in a limited space. Data centers, where large numbers of computers are typically housed, often use numerous cabinets to house various computers, storage devices, and other electronic devices.

With the large number of computers and other devices in a data center, rack cabinets are often densely packed with computers and/or other devices. However, each computer and/or device typically has one or more cables for power and signaling. This often creates a large tangle of cables at the rear of the rack cabinet, making it difficult to remove, replace, and/or service computers or other devices in the cabinet rack.

Typical rack management solutions concentrate on a single aspect of the management picture and have no common interface or control schema. Some solutions provide remote keyboard, video and/or mouse access over a network or the remote control of power management. However, there are no products that address management of the entire rack cabinet and/or a data center of rack cabinets. The majority of these management solutions and/or products are also not scaleable on a per port basis but rather a plurality of ports at a time (e.g., eight at one time). Thus, it makes it difficult to add functionality and/or resources on an as-needed basis.

Additionally, because prior art solutions provide separate management interfaces, it makes it cumbersome to manage, maintain, and monitor a data center with several server racks.

SUMMARY OF THE INVENTION

One embodiment of the invention provides a fully distributed, scaleable and modular rack architecture and management system. One feature of the invention provides device management throughout the rack with a vertical interface column integrated into the rack cabinet. Within each rack unit (U) of the vertical column, the system delivers connectivity to keyboard, video and mouse (KVM), Universal Serial Bus (USB), and Serial RS232 through a hot-swappable Server Interface Module card (SIM). In one implementation, the vertical column may be populated with 1 to 42 SIM modules (in each U or 1.75" slot) directly behind the devices (e.g., server, network apparatus, storage devices, etc.) within the rack cabinet thereby eliminating vertical runs of cable typically necessary for management of such devices.

The Vertical Column feeds into the Control Module, which is a 1 U chassis typically mounted in the top of the cabinet. In addition to carrying out the core control and switching logic, the Control Module facilitates hot-swappable user card slots. This allows each rack device to be controlled by one or more concurrent users. These users may gain access to devices within a rack locally via a Local Interface Module (LIM) that allows a rack-mountable integrated keyboard, display unit, and mouse to be mounted within and flat panel drawer. Moreover, a Remote Interface Module (RIM) can be deployed within the control unit to provide remote management over a 10/100/1000 TCP/IP network. A client software application may provide access to devices within a server rack using either a standalone security logon or through the primary security scheme provided by the network's Active Directory protocols.

The Control Module may provide additional serial management ports to control devices such as power distribution units, environmental management, cabinet locks and direct connections for managed network hubs or switches. The Control Module may also have a dedicated port for an optional external modem in order to provide dial-up remote management access to the system in the event of a catastrophic network failure.

One embodiment of the vertical column provides a smaller integrated column that can economically handle compact options of 14 U, 28 U, or any sub 42 U combination.

One feature of the invention provides centralized management of server, network, power and environmental equipment within a rack cabinet to a single IP address. Additionally, an embodiment of the invention provides a scaleable solution that permits adding components and/or devices (e.g., servers, network equipment, etc.) as well as regulates the total number of users accessing those devices. This allows customers to grow their infrastructure without the need to invest in oversized equipment on the initial deployment.

One embodiment of the invention may provide low-level connectivity to a combination of input/output devices (e.g., keyboard, video display, mouse, serial interface and/or universal serial bus (USB) for equipment within a rack. These input/output devices can be addressed locally within the rack or remotely over an IP Network.

DETAILED DESCRIPTION

Figure 1:
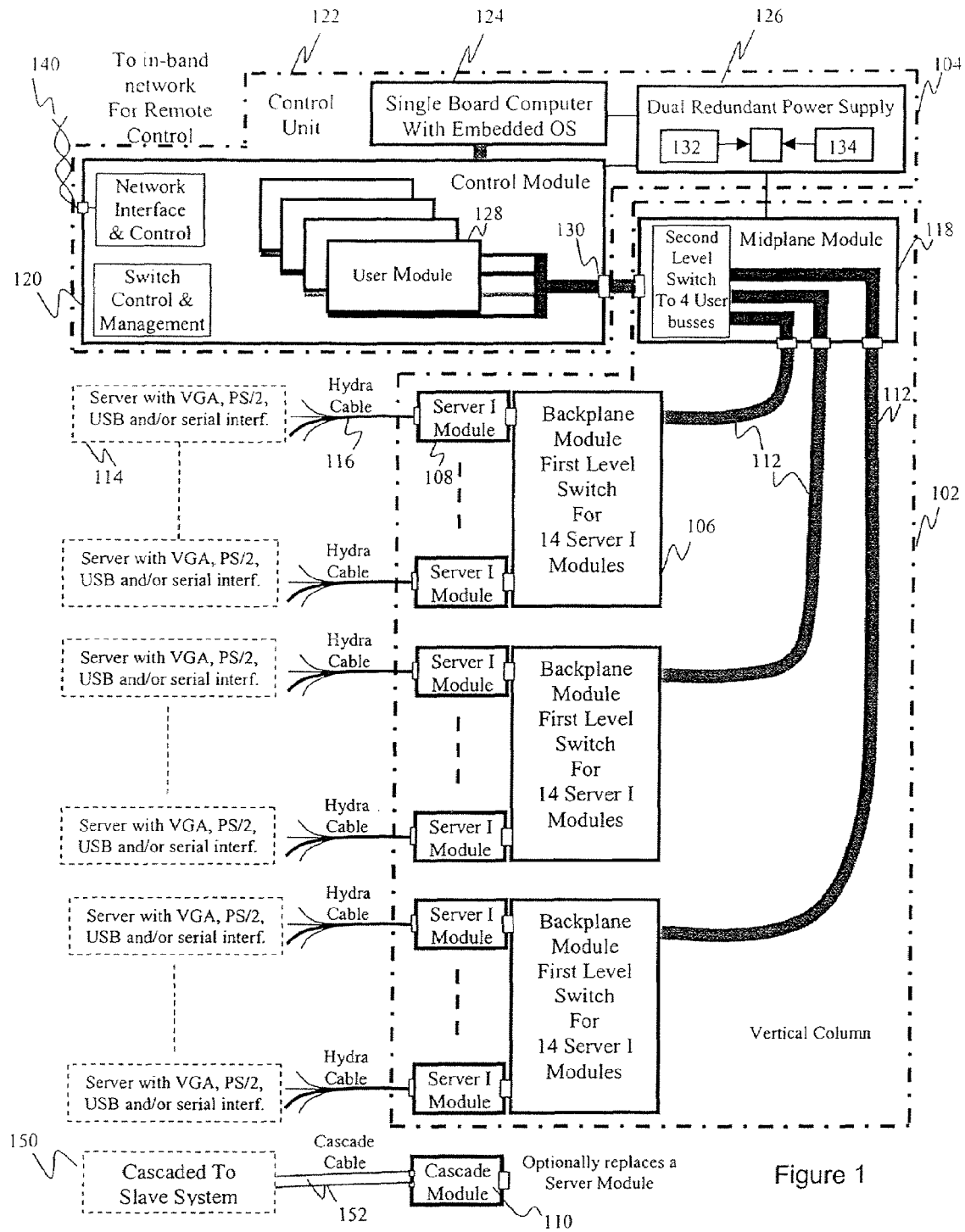
FIG. 1 is a block diagram illustrating the various components of a Rack Management System according to one embodiment of the invention.

In the following description numerous specific details are set forth in order to provide a thorough understanding of the invention. However, one skilled in the art would recognize that the invention may be practiced without these specific details. In other instances, well known methods, procedures, and/or components have not been described in detail so as not to unnecessarily obscure aspects of the invention.

In the following description, certain terminology is used to describe certain features of one or more embodiments of the invention. For instance, the term "data center" refers to a collection of one or more computers, servers, storage device, and/or network equipment in one or more racks, either in the same location and/or linked by a network. The term "rack", as in rack cabinet, server rack, etc., refers to any physical structure that houses one or more servers, storage devices, and/or network devices. The term "interface column" includes columns with electrical couplers that may be positioned in any orientation, including vertically.

Generally, one embodiment of the invention provides a centralized rack management system bridging the fractured proprietary management protocols from different vendors and across various data center products. One feature of the rack management system reduces or eliminates the vertical runs of management cables within the server rack. Another feature of the rack management system provides a "pay as you grow" server rack and management platform that can be customized to each specific application.

According to one implementation of the invention, each rack cabinet may be associated with a corresponding Internet Protocol (IP) address. This permits accessing, controlling, and managing devices, such as servers, data storage devices, and/or network equipment, housed within each rack cabinet. Such feature opens the ability not only to manage servers through a common interface, but also to integrate capabilities such as asset management, security management and power management.

One aspect of the invention addresses the issues of high-density server and network device management. Management has become fractured with various proprietary management solutions from hardware manufacturers of server and network devices. With the deployment of grouped racks throughout a data center, the invention also centralizes management of servers, power, and environmental conditions within each individual rack cabinet.

Conventional rack management solutions typically require a user to terminate out-of-band management cables within a specific horizontal plane of a rack cabinet (i.e., rack unit 23 of 42). One embodiment of the present invention employs a vertical column to distribute the management hardware connectivity into a vertical plane thereby eliminating the issues of cabling and cable management. Additionally, the invention provides a completely scaleable solution for management of a plurality of devices (e.g., one to forty-six devices—forty-two keyboard, video, mouse, USB, serial, plus four additional serial devices) within the rack and also enable one or more users to address or access the devices simultaneously.

One implementation of the invention can be scaled and/or configured to handle 1-N devices, where N is the maximum number of devices (e.g., servers, network equipment, data storage devices, etc.) that can fit into a rack. Such system may be configured so that a single user interface device mounted in a first rack cabinet permits an operator to monitor and/or control equipment and/or computer servers located in both the first rack cabinet and other rack cabinets.

FIG. 1 is a block diagram illustrating the various components of a rack management system according to one embodiment of the invention. In this implementation the management system includes two subsystems, a Vertical Column 102 and a Control Unit 104. They are communicatively coupled, via a cabling system for instance, to transfer digital signals, analog signals and power.

The Vertical Column 102 holds one or more switching Backplane Modules (BM) 106. Each Backplane Module 106 may house up to N (e.g., N is 14) Server Interface Modules (SIM) 108. Alternately, where the rack unit location does not have a rack device, the Server Interface Modules 108 can be replaced with Server Cascade Modules 110 to extend the control to slave systems. A Midplane Module (MM) 118 is communicatively coupled to each Backplane Module 106 to merge the multiple backplane buses 112.

Each Server Interface Module 108 is in close proximity to the rack devices 114 (e.g., server or network equipment) assigned to its rack unit location. The Server Interface Module 108 is communicatively coupled to its corresponding server 114 via a short cable 116. In one implementation of the invention a short cable 116 carries the set or subset of interfaces including video (e.g., VGA), PS/2 keyboard/mouse, universal serial bus (USB), and serial RS232. The Server Interface Module 108 has the necessary hardware and software to emulate the physical devices that the server 114 expects. That is, the Server Interface Module 108 merges/consolidates a variety of digital signals into a single high-speed bus along with a separate analog video line.

The Backplane Module 106 can be configured to selectively switch the high-speed digital "pipe" and video from each Server Interface Module to each of the N (e.g., N is 4) user buses. At the top end of the vertical column 102 there is a Midplane Module 118 which performs a second level switch selection of Server Interface Module signals in order to consolidate the Server Interface Module signals 112 from all of the Backplane Modules 106 and connect to each of the N user buses 130. In addition to this high-speed data and analog video switched path to each server there is also a serial bus that links all modules (e.g., SIMs, BMs, MM) to provide operational and maintenance (management) control by the Control Module (CM) 120 inside the control unit 122.

The Control Unit 122 houses a Control Module 120, Single Board Computer (SBC) 124, and Dual Redundant Power Supply (DRPS) 126. The Control Module 120 houses a backplane system that allows User Modules (UM) 128 to be plugged in. There are at least three different types of User Modules: Local User Interface Module (LIM), Remote User Interface Module and the User Cascade Interface Module (UCIM). The Control Module 120 has multiple processors that manage and control all the modules (e.g., SIM, BM, MM, UM) and provides the network interface for remote management. Through the Network Interface 140 the data path to the servers 114 and the management bus are extended beyond the confines of the local system.

The Dual Redundant Power Supply 126 includes two identical power sources 132 and 134, from the AC input all the way to the output DC voltage, which are combined with proper isolation for continued normal operation in the event of failure on one of the power sources.

The Single Board Computer 124 may be a self-contained module with enough processing power, and resources (e.g., RAM, mass storage, network controller, etc.) to run an embedded operating system (e.g., Microsoft Windows XP™) with high-powered applications. According to one implementation of the invention, software operating in the Single Board Computer 124 enables automated self-configuration and provisioning of the managed servers 114. The Single Board Computer 124 executes applications that continuously gather data from the servers 114, receiving control events from the outside world and affecting changes of state and configurations within. The Single Board Computer 124 performs the above tasks, which are usually subordinated to the decision making process and implementation of an IT specialist.

A Server Cascade Module 110 can replace one of the Server Interface Modules 108, with the purpose of controlling other slave systems 150. The slave systems may be configured with User Cascade Interface Modules to allow the control by the master system 122. The connection between the master system 122 and a slave system is via one or more cables 152. In addition to the server resources of the master system, once the slave system is coupled to the master system all the server resources from the slave system are also available to the master system. In one implementation, a master system may have a cascade module 110 coupled to a User Cascade Interface Module in a Control Unit of a slave system to permit control and/or monitoring of the slave system by the master system.

Figures 2, 3:
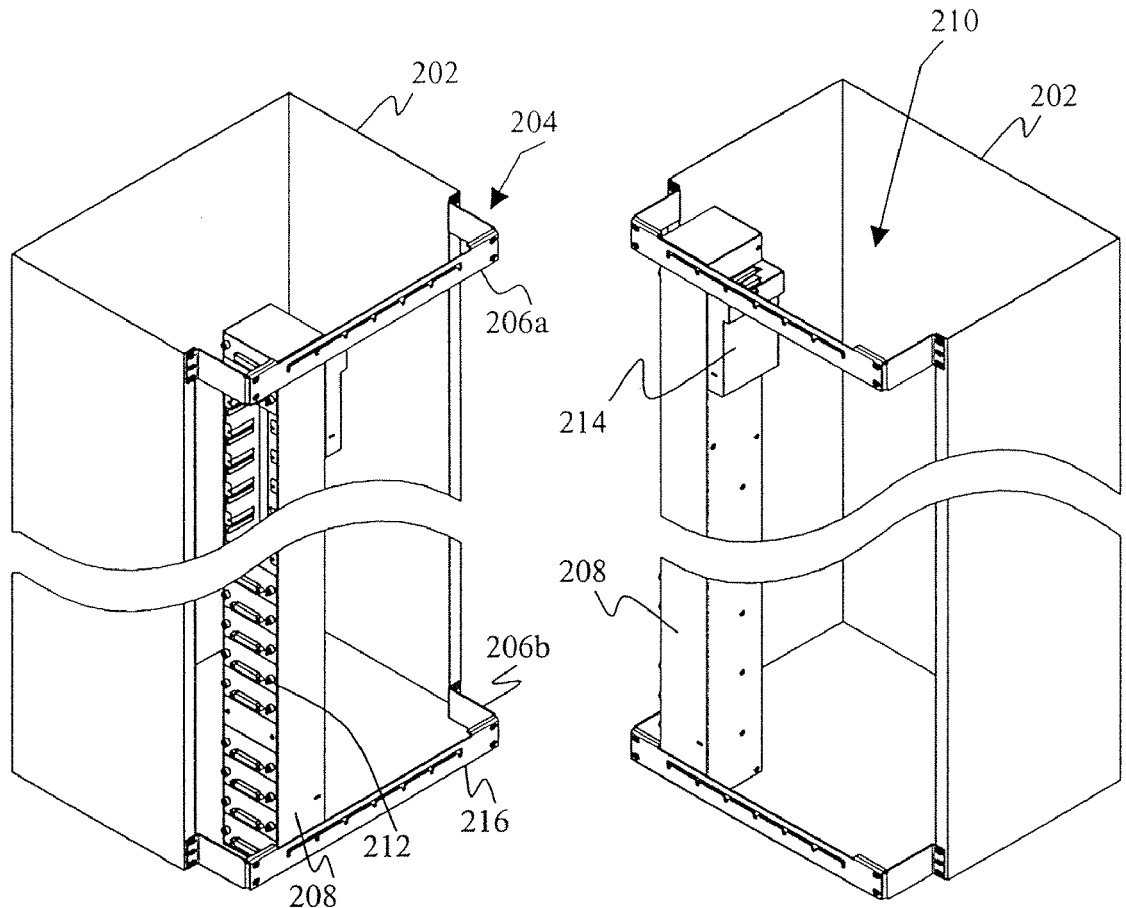
FIGS. 2 and 3 illustrate a Vertical Column mounted in a Rack Cabinet according to one embodiment of the invention.

FIGS. 2 and 3 illustrate a Vertical Column mounted in a Rack Cabinet according to one embodiment of the invention. In one implementation of the invention, the rack cabinet 202 includes a rear portion 204 with rails or brackets 206 in which a Vertical Column 208 can be secured. The Vertical Column 208 can be placed at various positions along the rails 206. The rack cabinet 202 also defines a space 210 in which one or more devices, such as servers, network equipment and/or other devices, may be mounted.

According to one embodiment of the invention, in order to support the Vertical Column 208, the rack cabinet 202 includes two or more mounting brackets 206, that may span a standard 19" rack cabinet. Each bracket 206 may be symmetrical and 1 U in height. In one implementation of the invention, one bracket 206a is mounted behind the first rack slot (e.g., unit number 1) and another bracket 206b is mounted behind the last rack slot (e.g., unit number 42). The brackets 206 are coupled to the mounting supports of the rack cabinet 202 and the Vertical Column 208 is set into the keyhole 216 that provides the optimal position within the rack cabinet 202 to couple the rack devices (e.g. servers, network equipment, storage devices, etc.). There may be a plurality of keyhole mount points 216 along the length of the brackets 206.

Figure 4:
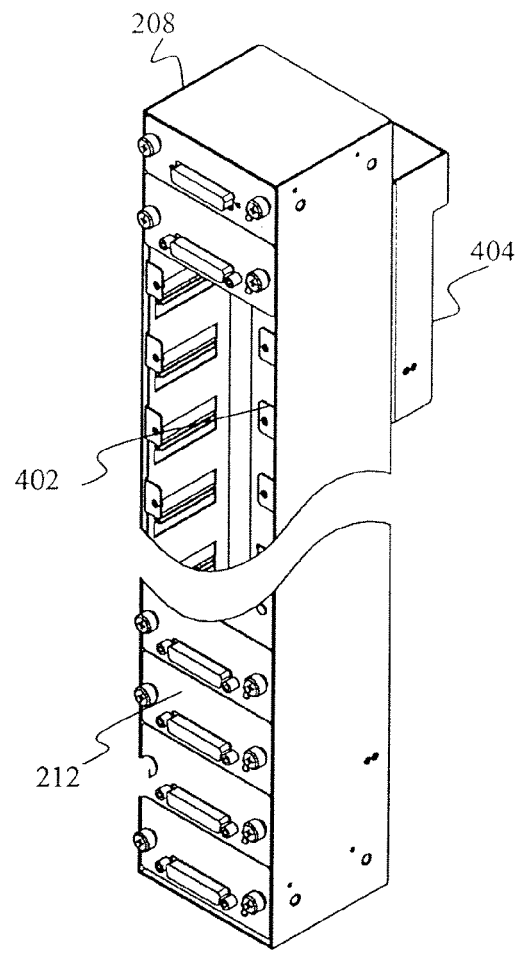
FIG. 4 illustrates a Vertical Column with Server Interface Modules installed therein according to one embodiment of the invention.

According to one implementation of the invention, the Vertical Column 208 is a 42 U chassis that has a cross section of approximately 3.3 inches by 3.75 inches. Each U in the Vertical Column 208 contains a slot that can be filled with either a Server Interface Module 108 for providing device access, a Cascade Module 152 or a blank cover. One or more Backplane Modules 106 may be located in the Vertical Column 208 to receive the Server Interface Modules 212 (FIG. 1, 108). The Backplane Modules 106 are electrically coupled to the Midplane Module 214 (FIG. 1, 118; FIG. 4, 404) by cables and/or buses inside the Vertical Column 208.

The Vertical Column 208 may be configurable to provide different numbers of U slots. For example, the Vertical Column 208 could be reduced to 28 U or 14 U or any sub 42 U combination height. Consequently, the number of Backplane Modules within the Vertical Column 208 may also be changed as necessary.

FIG. 4 illustrates a Vertical Column 208 with Server Interface Modules 212 installed therein according to one embodiment of the invention. The Vertical Column 208 houses modular Server Interface Modules 212 along each 1U section. The Server Interface Modules 212 are coupled to connectors on one or more Backplane Modules 402 that are arranged along the rear of the Vertical Column 208. Such architecture helps reduce the length of the interface cables communicatively coupling the servers or other devices mounted in the rack cabinet 202 and their corresponding Server Interface Modules 212. As previously discussed, the overall Vertical Column 208 location may also be adjustable along the support rails 206 to further minimize the distance between the Vertical Column 208 and the servers or devices within the rack cabinet 202.

The Server Interface Modules 212 may be field and user installable to allow for growth and flexibility. For example, a user may add Server Interface Modules 212 to the Vertical Column 208 as servers and/or network equipment is added to a rack cabinet 202. Additionally, the Vertical Column 208 may also be used for adding mechanism to house additional cables for the rack cabinet 202, such as network wiring and/or other types of cables.

Figure 5:
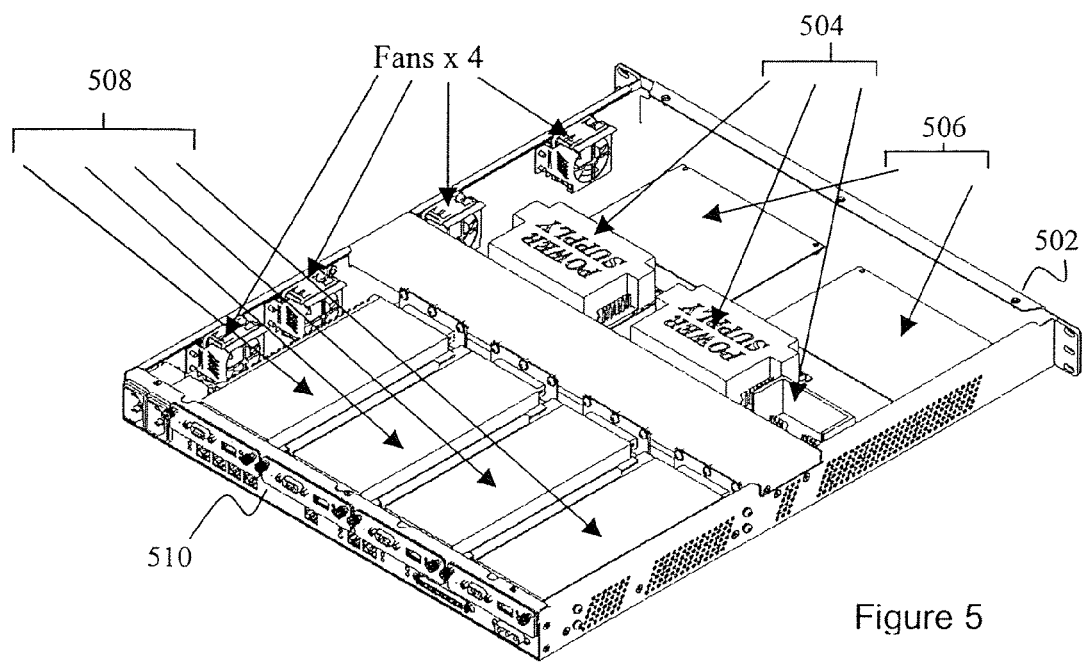
FIG. 5 illustrates a Control Unit according to one embodiment of the invention.

FIG. 5 is a Control Unit 502 (illustrated as 122 in FIG. 1) according to one embodiment of the invention. The Control Unit 502 includes a Dual Redundant Power Supply 504 to provide failsafe operation and one or more Single Board Computers 506 to implement the enhanced system features. Additionally, the Control Unit 502 may also include one or more Control Modules 510 and one or more User Modules 508 to manage the communication interface with servers and other devices in the rack cabinet 202. A plurality of User Modules 510 may serve to provide local, remote and/or cascaded access to Server Interface Modules (FIG. 1, 108) through the Control Unit 502. The User Modules and Control Modules 508 may be separate components that can be installed in the field to allow for growth flexibility.

Figure 6:
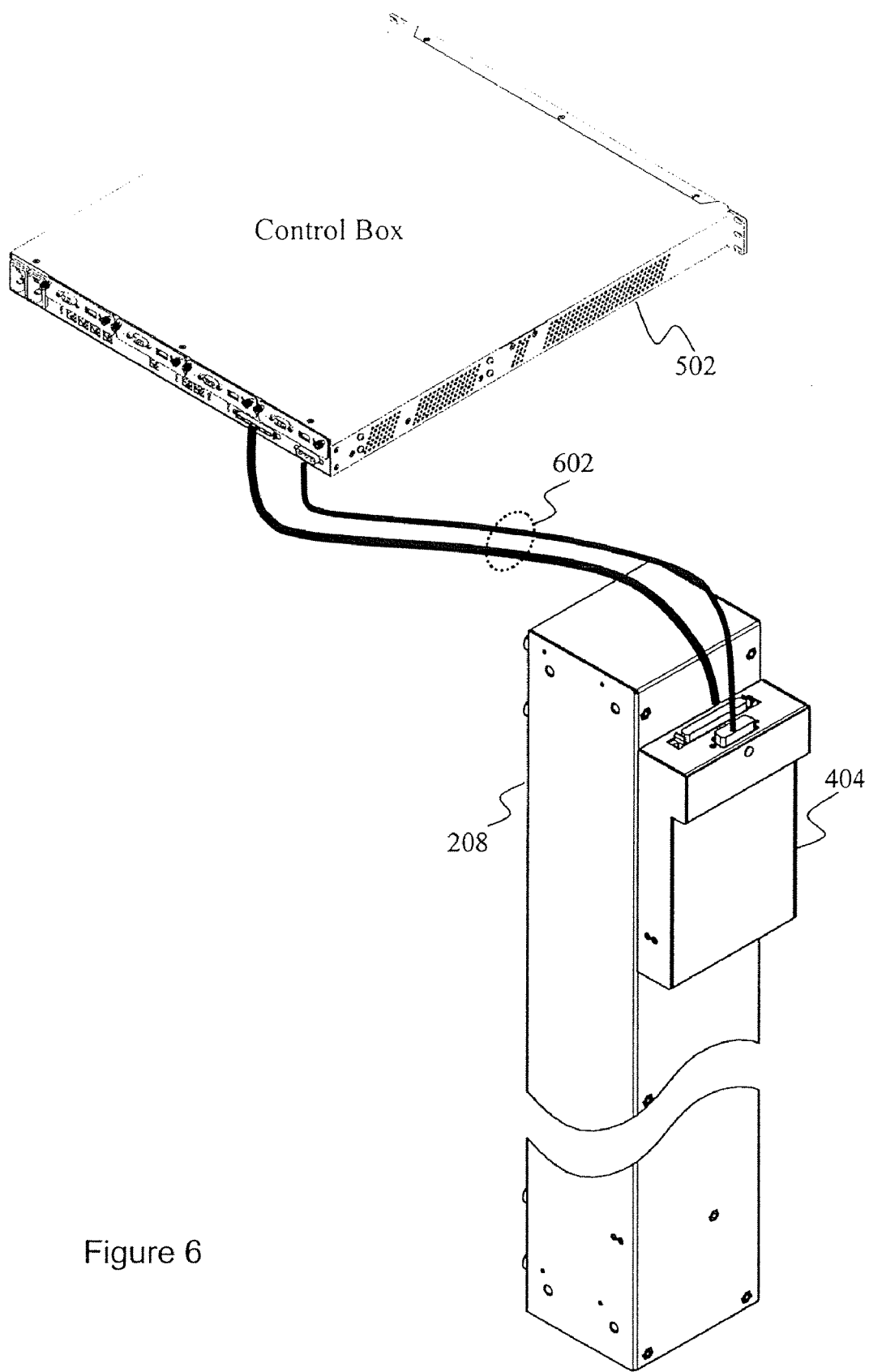
FIG. 6 illustrates how the Vertical Column is coupled to a Control Unit according to one embodiment of the invention.

FIG. 6 illustrates how the Vertical Column 208 is coupled to a Control Unit 502 according to one embodiment of the invention. The top of the Vertical Column 208 provides a power connection and signal connection to the Control Unit 502. One or more power and/or communication cables 602 are coupled from the Control Unit 502 to a Midplane Module 404 attached to the Vertical Column 208.

In one implementation of the invention, the control unit 502 may be installed inside of the rack cabinet 202, above the Vertical Column 208, occupying a 1 U space. Since it is in an area that is above and out the server and network equipment U space, it is optimal to bring out all external interfaces there for clutter free cabling.

Figure 7:
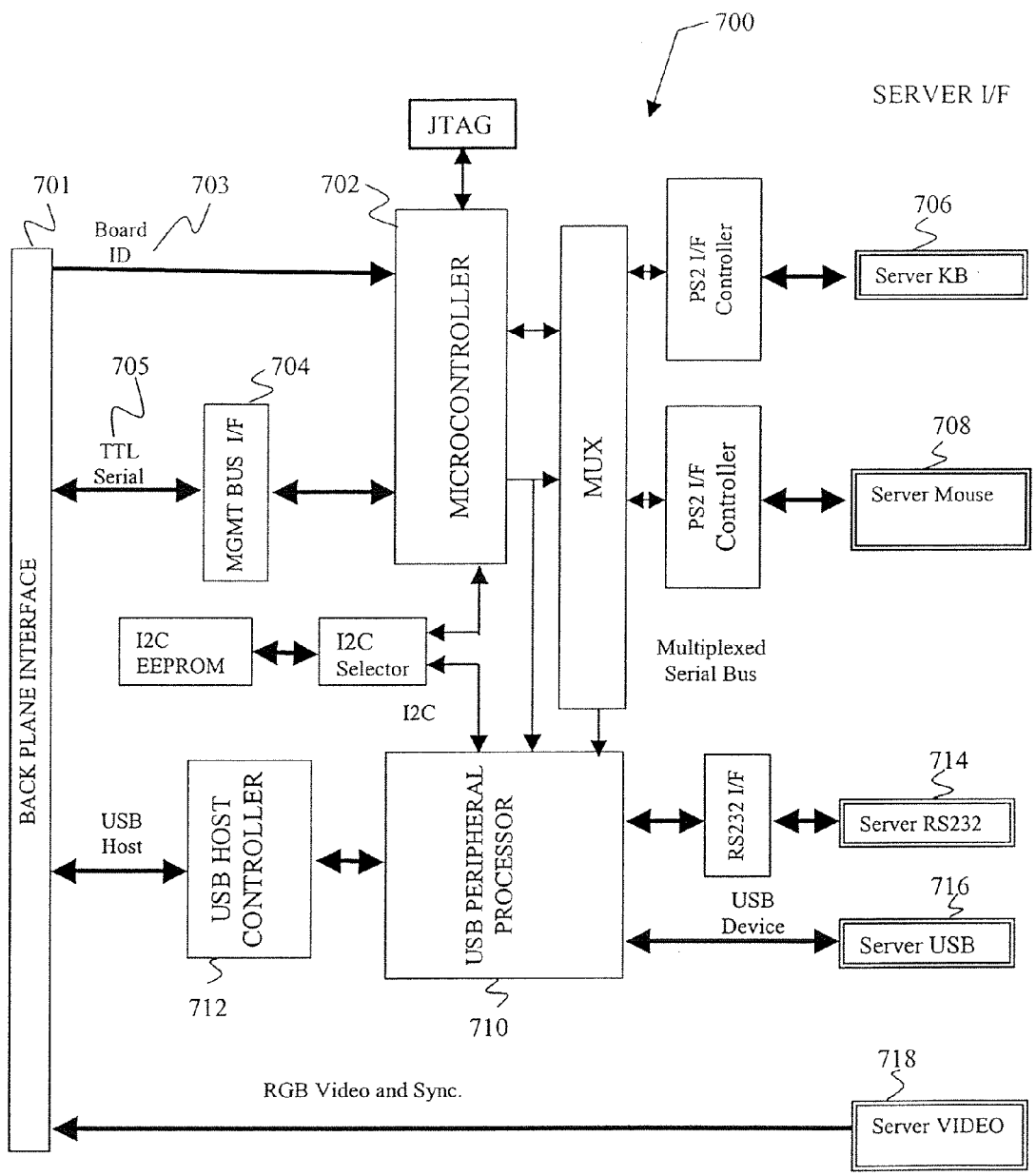
FIG. 7 is a block diagram illustrating the components of a Server Interface Module according to one embodiment of the invention.

FIG. 7 is a block diagram illustrating the components of a Server Interface Module 700 (illustrated as 108 in FIG. 1) according to one embodiment of the invention. The Server Interface Module 700 (also illustrated in FIG. 4 as 212) is a small electronic board or card that can be plugged into an interface in the Vertical Column 208. A plurality of Server Interface Modules 700 may be distributed along the Vertical Column 208 (as illustrated in FIG. 4).

One purpose of the Server Interface Module 700 is to reduce the number of cables that run along the back of a rack cabinet 202. The Server Interface Module 700 reduces the number of cables that would otherwise run along the back of a rack cabinet 202 by concentrating a plurality cables into a single, multiple use cable. The Server Interface Module 700 has an interface 701 that plugs into a bus running along the backplane of the Vertical Column 208. The backplane bus carries a plurality of different signal, such as Board ID, TTL signals, Universal Serial Bus (USB), and RGB video and synchronization, to and from the Server Interface Module 700. These signals may be concentrated into a single interface to couple them to a device (e.g., server, network equipment, storage equipment, etc.) in a rack cabinet.

Figure 8:
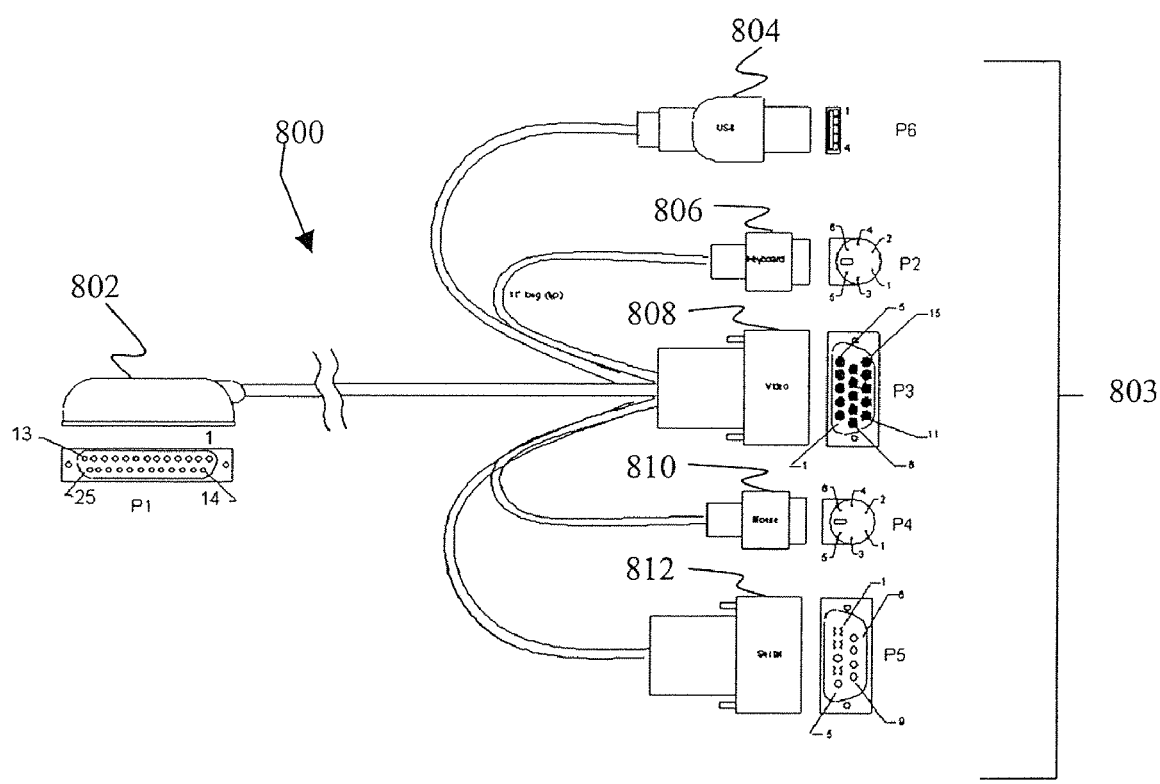
FIG. 8 illustrates one embodiment of a hybrid cable that may be used to couple a server to a server interface module according to one embodiment of the invention.

A hybrid cable may be used to bundle all of the signals into a single cable interface at the Server Interface Module 700 end while providing a plurality of standard interfaces at the server or network equipment end. FIG. 8 illustrates one embodiment of a hybrid cable 800 that may be used to couple a device, e.g., server or network equipment, to a Server Interface Module according to one implementation of the invention. This hybrid cable 800, along with the Vertical Column 208, reduces the number of individual cables that would otherwise need to run to each server in a rack unit.

According to one implementation of the invention, the hybrid cable 800 includes a connector 802 at a first end to couple to a Server Interface Module. At the opposite end 803, the hybrid cable 800 splits into multiple cable interfaces. For example, the second end of the hybrid cable 800 may be split into universal serial bus (USB) interface 804, a keyboard connector 806, a video connector 808, a mouse connector 810, and a serial port connector 812.

According to one implementation of the invention, the connector 802 is a twenty-five (25) pin connector in which pins are allocated such that all connectors at the second end 803 can be adequately supported. For example, the following table illustrates one scheme for combining various connectors into a hybrid twenty-five pin cable connector.

| Twenty-five pin connector | Corresponding Signal |
| --- | --- |
| 18 | RS232 - Rx Data |
| 19 | RS232 - Tx Data |
| 20 | RS232 - Signal Ground |
| 25 | USB - Power |
| 23 | USB - Data + |
| 24 | USB - Data − |
| 22 | USB - Ground |
| 7 | Keyboard - Data |

-continued

| Twenty-five pin connector | Corresponding Signal |
| --- | --- |
| 6 | Keyboard - Signal Ground |
| 9 | Keyboard - Power (+5 V) |
| 8 | Keyboard - Clock |
| 12 | Mouse - Data |
| 6 | Mouse - Signal Ground |
| 13 | Mouse - Power (+5 V) |
| 11 | Mouse - Clock |
| 1 | Video - Red |
| 2 | Video - Green |
| 3 | Video - Blue |
| 14 | Video - Red Signal Return |
| 15 | Video - Green Signal Return |
| 16 | Video - Blue Signal Return |
| 17 | Video - Synchronization Ground |
| 21 | Video - DDC Clock |
| 10 | Video - DDC Data |
| 4 | Video - Horizontal Synchronization |
| 5 | Video - Vertical Synchronization |

In this manner, all twenty-five (25) pins of the connector 802 are used to electrically couple to connectors 804, 806, 808, 810, and 812.

Referring again for FIG. 7, the Server Interface Module 700 may include a plurality of components to process and/or manage the signals across the Server Interface Module 700. A microcontroller 702 receives a Board ID signal 703 and determines if particular signals are addressed to it. If so, a management bus 704 carries TTL serial signals 705 to and from the microcontroller 702. This bus 704 may be used to carry control signals to and/or from a remote system. The keyboard and/or mouse ports 706 and 708 of a server coupled to the Server Interface Module 700 are handled by peripheral processor 710 so that it can be transferred to processor 712 and then may be used to carry them to a remote system. Additionally, one or more peripheral processors 710 and 712 may process and transfer signals between the backplane of the vertical column and the server coupled to the Server Interface Module 700. For instance, the peripheral processors 710 and 712 may receive and transmit USB signals to and from the backplane, and convert it to one or more signals to the server ports, such as RS232 port 714 signals or another USB port 716 signal. Other signals, such as the video signal from the server's video port 718, may pass through the Server Interface Module to the Backplane 701, undisturbed. Microcontroller 702 has access to all programmable devices (I2C EEPROM, PS2 processors) in the Server Interface Module, it can also communicate with the rest of the processors in the Server Interface Module board 700 (USB processor, PS2 processors). These are important features that allow the self-building and configuring of the Server Interface Module 700 during manufacturing.

The Server Interface Module 700 may be hot-swappable to permit expanding the number of modules in a Vertical Column without the need to shut off all devices in a rack cabinet connected to the Vertical Column. Such hat-swappable feature is made possible by detect-and-enable protection circuitry throughout the modules of the rack system monitoring software that identifies when new devices have been connected or come online and enabling them through the protection circuitry.

Figure 9:
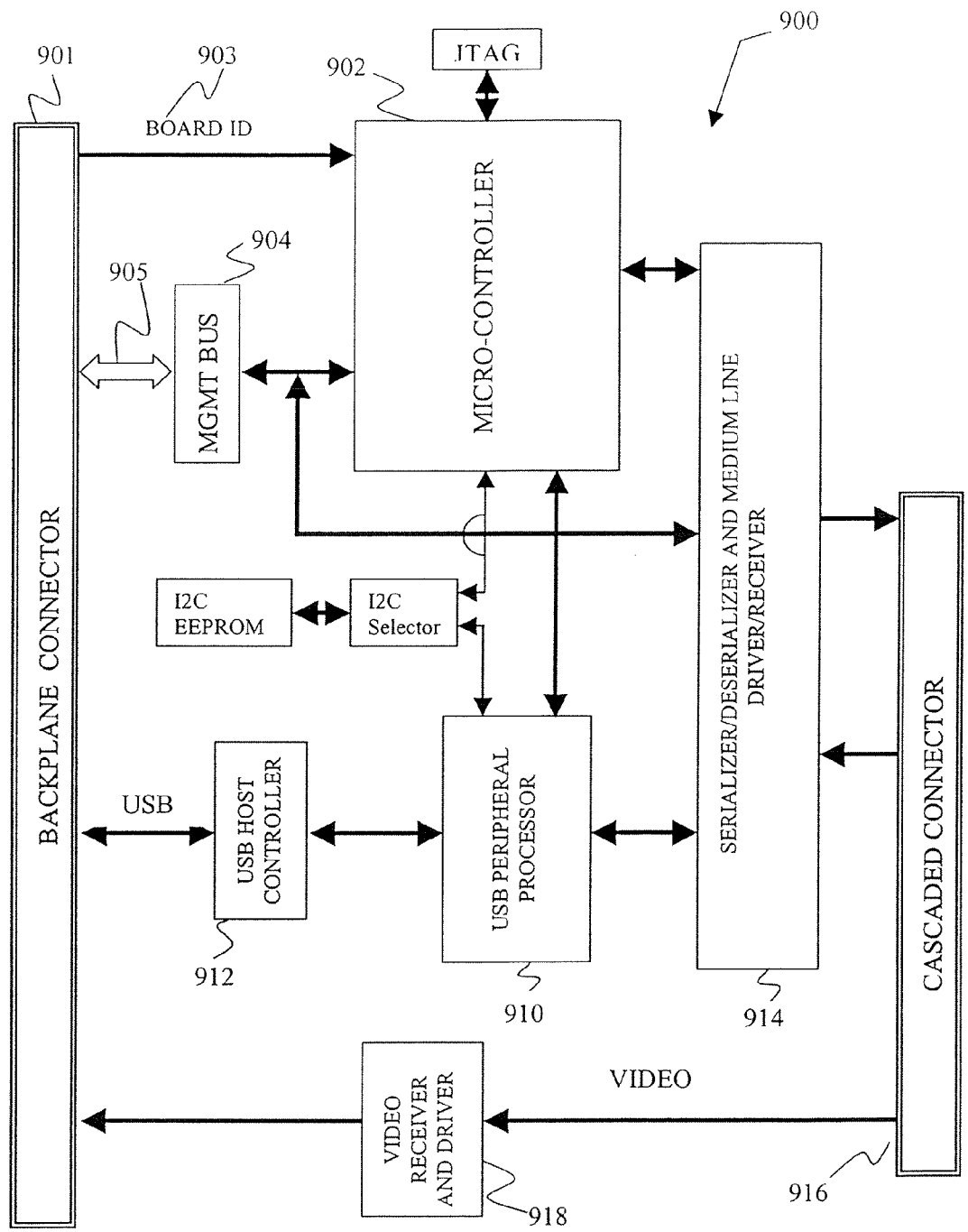
FIG. 9 is a block diagram illustrating the Cascade Server Interface Module according to one embodiment of the invention.

FIG. 9 is a block diagram illustrating the components of a Server Cascade Interface Module 900 (illustrated as 110 in FIG. 1) according to one embodiment of the invention. The Server Cascade Interface Module 900 is a small electronic board or card that can be plugged into an interface in the Vertical Column 208. A plurality of Server Cascade Interface Modules 900 may be distributed along the Vertical Column 208 (as illustrated in FIG. 4).

One purpose of the Server Cascade Interface Module 900 is to extend the control and access of a first system to other slave systems. The Server Cascade Interface Module 900 has an interface 901 that plugs into a bus running along the backplane of the Vertical Column 208. The backplane bus carries a plurality of different signal, such as Board ID 903, TTL signals 905, Universal Serial Bus (USB), and RGB video and synchronization, to and from the Server Cascade Interface Module 900. These signals may be concentrated into a single interface 916 to couple them to a User Cascade Interface Module (FIG. 15, 1500) that resides in a slave system.

Figure 15:
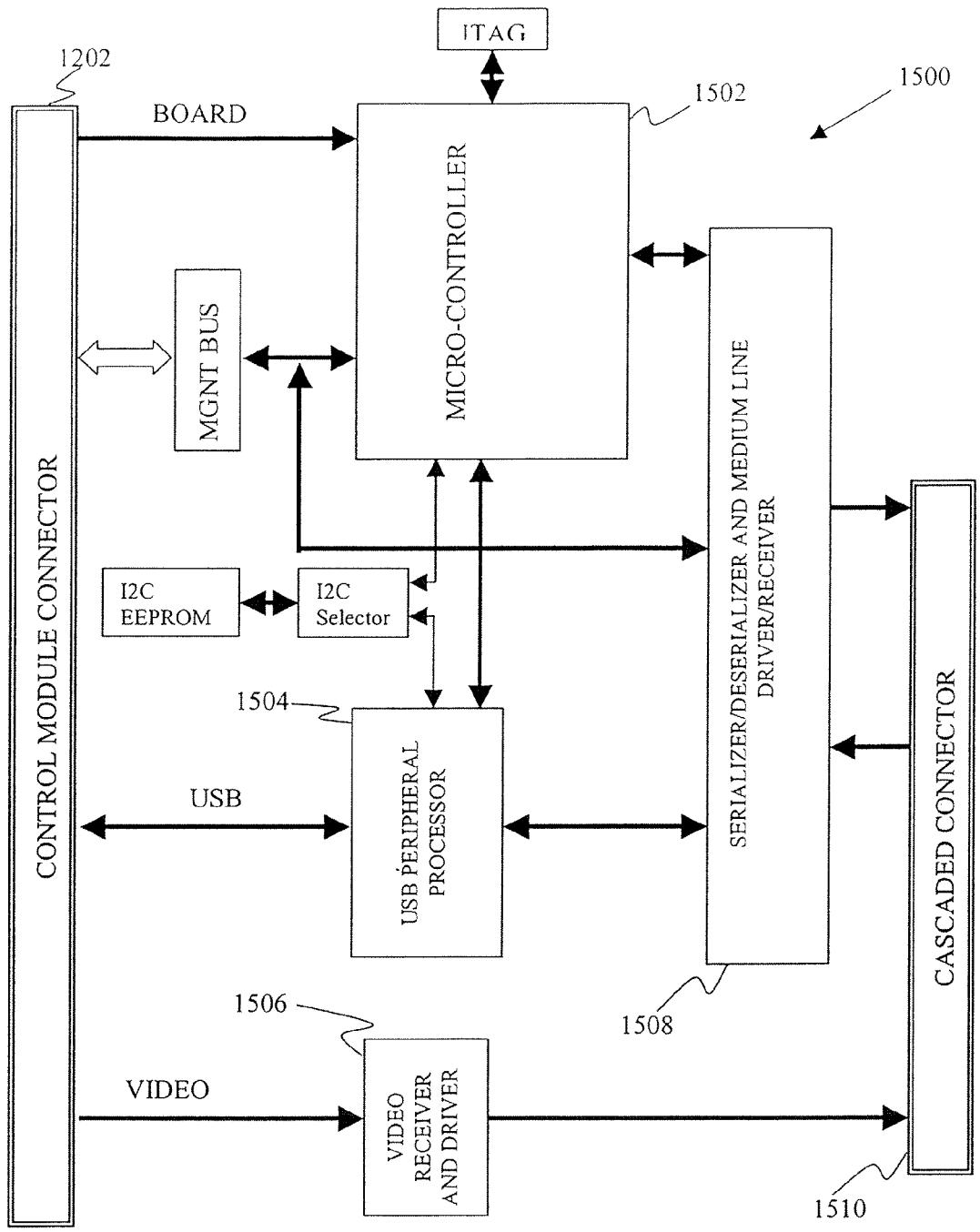
FIG. 15 is a block diagram illustrating the User Cascade Interface Module according to one embodiment of the invention.

A special or standard off-the-shelf cable may be used to bundle all of the signals into a single or dual cable interface(s) that interconnects the Server Cascade Interface Module 900 to the slave's User Cascade Interface Module (FIG. 15, 1500). The design of the Video driver 918 and the Data Serializer Driver/Receiver 914 in conjunction with the Connector Interface 916 in the Server Cascade Interface Module 900, reduces the number of individual cables that would otherwise need to run between cascaded rack units.

The Server Cascade Interface Module 900 may include a plurality of components to process and/or manage the signals across the Server Cascade Interface Module 900. A microcontroller 902 receives a Board ID signal 903 and determines if particular signals are addressed to it. If so, a management bus 904 carries TTL serial signals 905 to and from the microcontroller 902. This bus 904 may be used to carry control signals to and/or from a remote control system. Additionally, one or more peripheral processors 910 and 912 may process and transfer signals between the backplane of the Vertical Column and the slaved rack unit coupled to the Server Cascade Interface Module 900. For instance, the peripheral processors 910 and 912 may receive and transmit USB signals to and from the backplane, and convert it to one or more signals to the Data Serializer Driver/Receiver 914 and to the Cascaded Connector 916. Other signals, such as the video signal from the Cascaded Connector 916, may pass through the Video Receiver/Driver 918 to the Backplane 901, undisturbed. Microcontroller 902 has access to all programmable devices (e.g., I2C EEPROM, Data Serializer program) in the Server Cascade Interface Module 900, it can also communicate with the rest of the processors in the board: USB processor 910, Data Serializer 914. These are very critical features that allow the self-building and configuration of the board during manufacturing.

The Server Cascade Interface Module 900 may be hot-swappable to permit expanding the number of modules in a Vertical Column without the need to shut off all devices in a rack cabinet connected to the Vertical Column. Such hot-swappable feature is made possible by detect-and-enable protection circuitry throughout the modules of the rack system in conjunction with the monitoring software that identifies when new devices have been connected or come online and enabling them through the protection circuitry.

Figure 10:
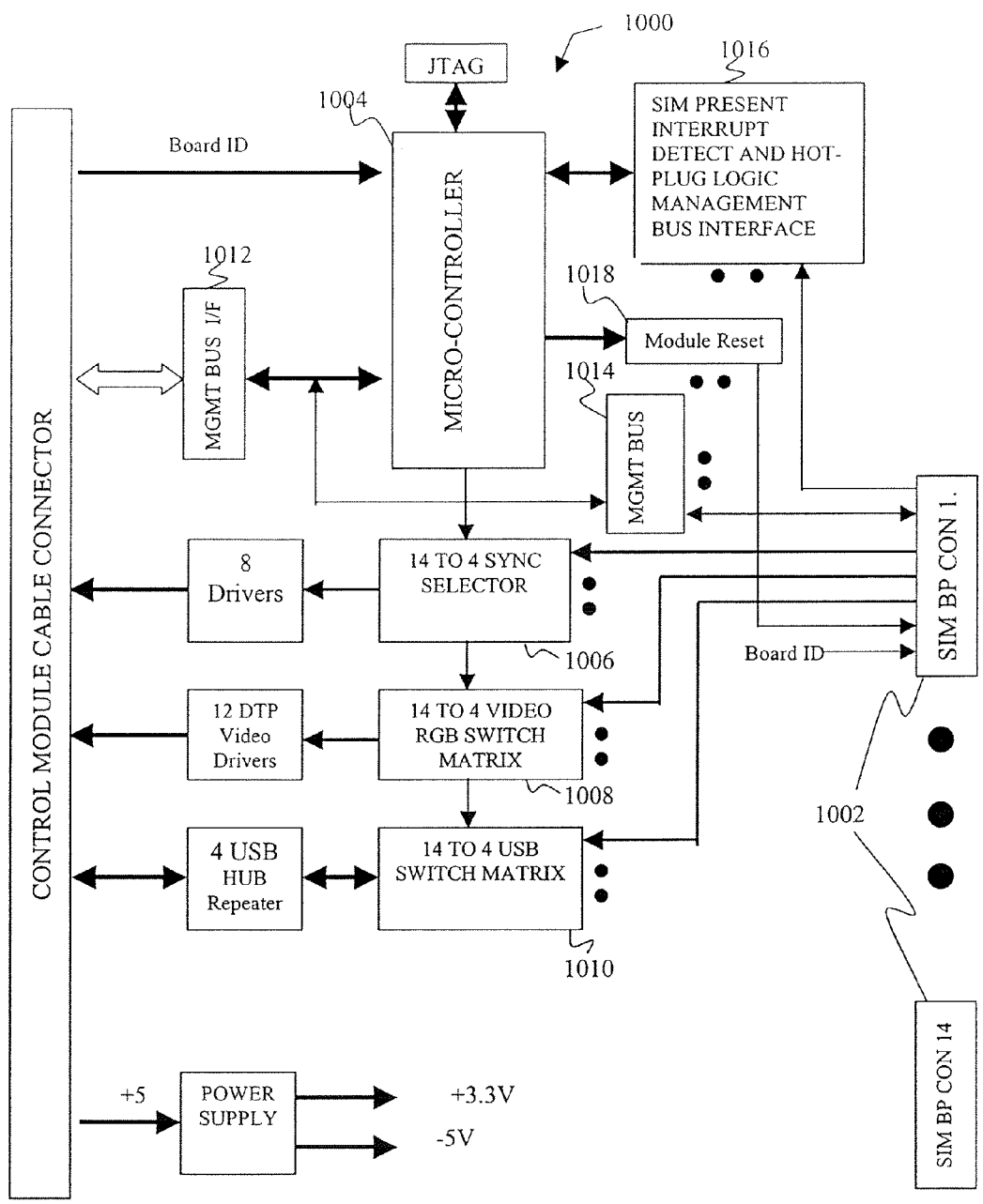
FIG. 10 is a block diagram illustrating a Backplane Module according to one implementation of the invention.

FIG. 10 is a block diagram illustrating a Backplane Module 1000 according to one implementation of the invention. The Backplane Module 1000 may be located within the Vertical Column and provide one or more interfaces in which to couple one or more Server Interface Modules (FIG. 1, 108; FIG. 7, 700). The Backplane Module 1000 is a switch that allows Server Interface Module cards (FIG. 1, 108; FIG. 7, 700) to plug to the connectors 1002 for power and routing of signals to the proper destination user module. In one implementation of the invention, each Backplane Module 1000 is segmented to handle up to fourteen (14) Server Interface Module cards (FIG. 1, 108; FIG. 7, 700) for flexibility in arranging different product configurations.

A Backplane Module 1000 may include a micro-controller 1004 that controls a plurality of switches 1006, 1008, and 1010 to select one of a plurality of Server Interface Modules (FIG. 1, 108; FIG. 7, 700) that may be coupled to the Backplane Module 1000 via connectors 1002. That is, the sync selector 1006 selects one of a plurality of synchronization signals from the Server Interface Modules (FIG. 1, 108; FIG. 7, 700) coupled to connectors 1002, the video switch 1008 selects one of the video signals coming from the Server Interface Modules, and the USB switch 1010 selects one of the USB signals from the Server Interface Modules. Signals from a management bus interface 1012 are transferred to and from the micro-controller 1004 and directly to a second management bus interface 1014 to the Server Interface Modules. The Backplane Module 1000 may also include a Server Interface Module detect-and-enable unit 1016 to detect when a Server Interface Module (FIG. 1, 108; FIG. 7, 700) is coupled to the connectors 1002 and enable operation of that Server Interface Module. A module-reset unit 1018 permits the Backplane Module 1000 to reset a Server Interface Module when instructed to do so.

Figure 11:
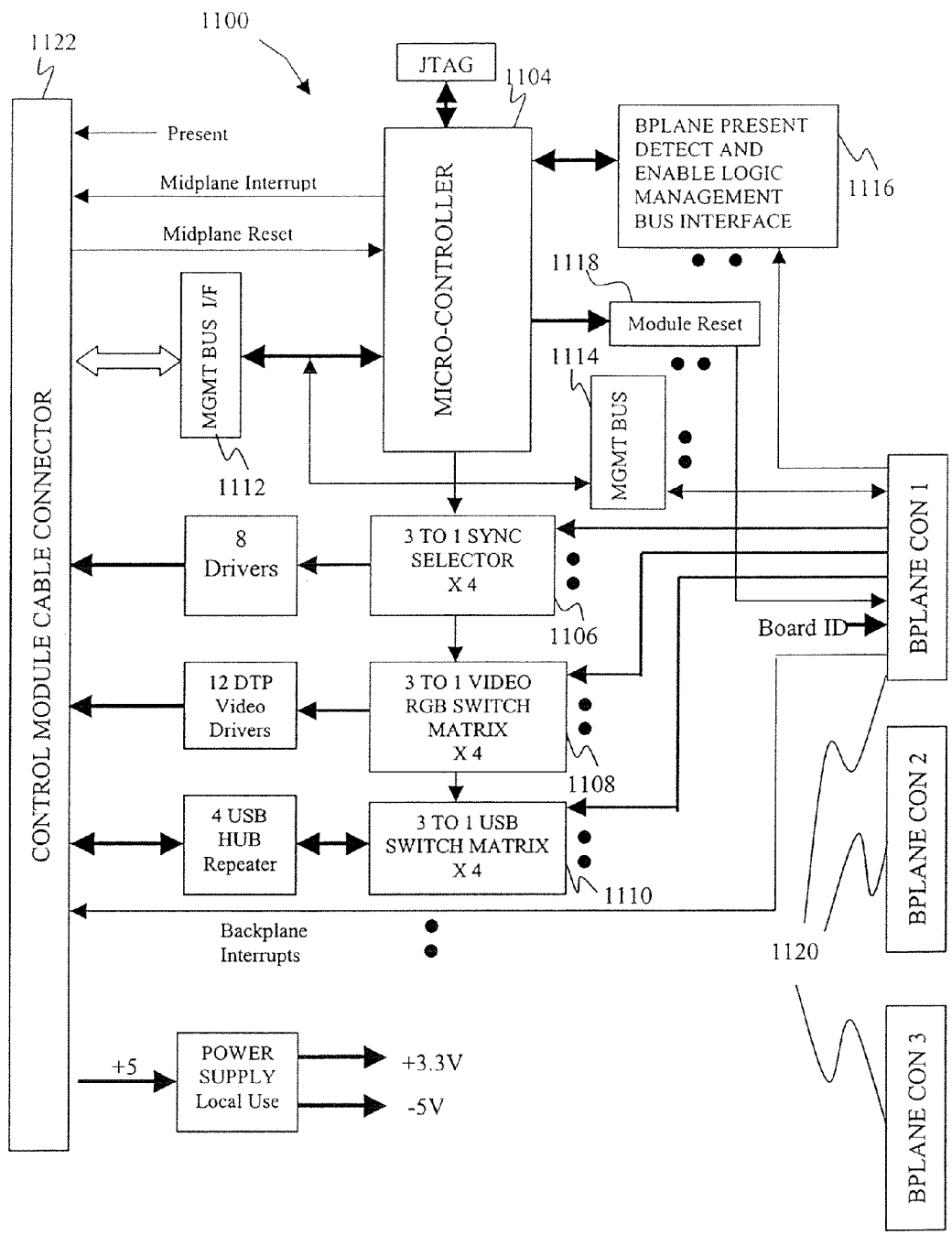
FIG. 11 is a block diagram illustrating a Midplane Module according to one embodiment of the invention.

FIG. 11 is a block diagram illustrating a Midplane Module 1100 (illustrated as 118 in FIG. 1) according to one embodiment of the invention. The Midplane Module 1100 is a switch that concentrates the signals from the different Backplane Modules 106 (FIG. 1) into a single bus to the Control Module 120 (FIG. 1). The Midplane Module 1100 has a similar layout as the Backplane Module 1000. A micro-controller 1104 controls signals to and from the Midplane Module 1100. The micro-controller 1104 receives control signals over the management bus 1112 and configures the selector 1106 and switches 1108 and 1110 accordingly to enable signal transmissions to and from a particular Backplane Connector 1120. The Midplane Module 1100 may also include a backplane detect-and-enable unit 1116 to detect when a Backplane Module (FIG. 10, 1000) is present at a Backplane Connector 1120 and enable operation of that Backplane Module. A module-reset unit 1118 permits the Midplane Module 1100 to reset a Backplane Module (FIG. 10, 1000) when instructed to do so.

The Midplane Module 1100 helps ease the cabling requirements between the Vertical Column 102 and the Control Module 120 (FIG. 1). That is, rather than having multiple cables running from each Backplane Module (FIG. 1, 106) to the Control Module 120, a single cable may be used between the Control Module cable connector 1122 and the Control Module connector 130 (FIG. 1).

Figure 12:
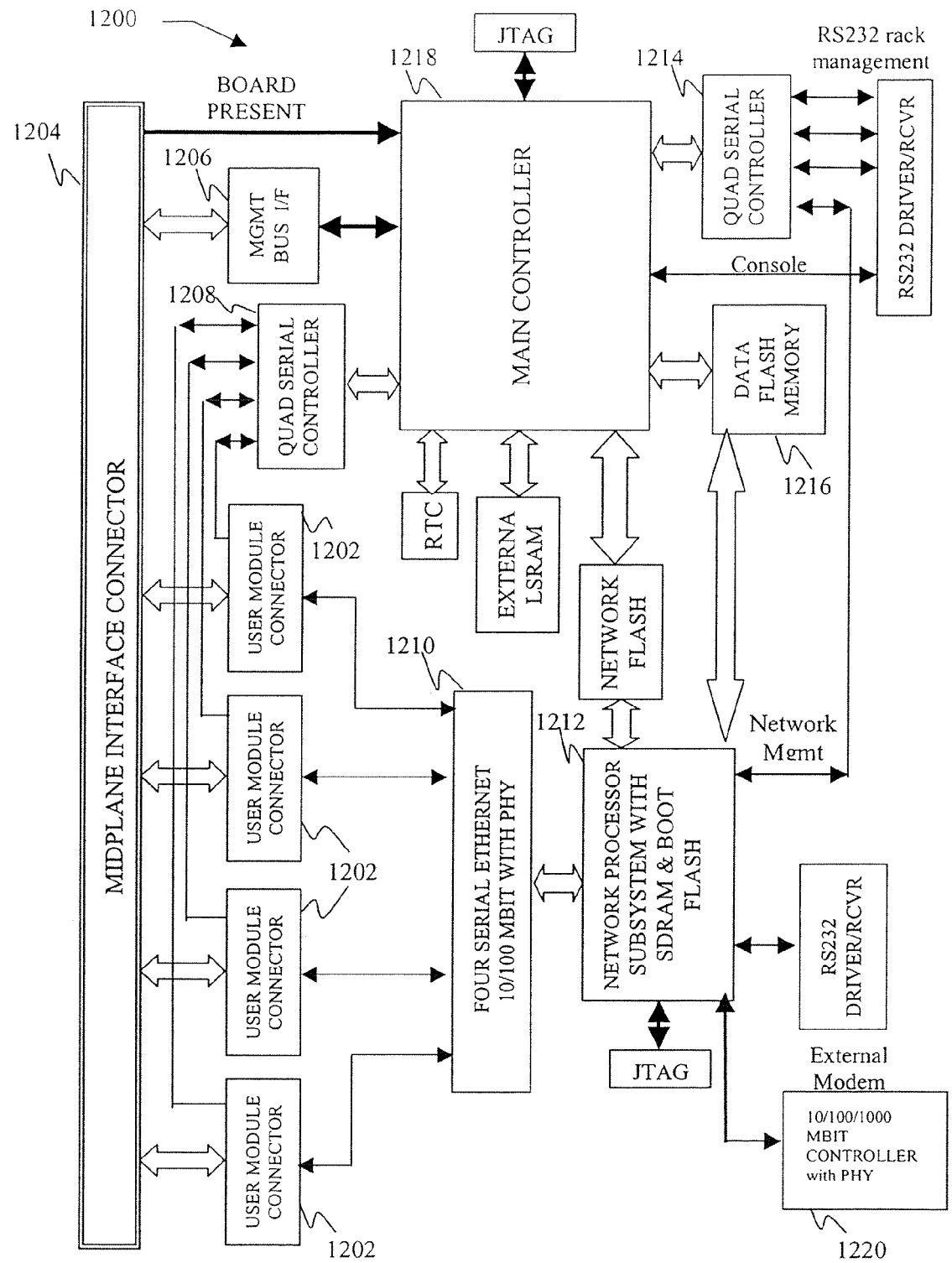
FIG. 12 is a block diagram illustrating a Control Module according to one embodiment of the invention.

FIG. 12 is a block diagram illustrating a Control Module 1200 (illustrated as 120 in FIG. 1) according to one embodiment of the invention. The Control Module 1200 provides the main switching control unit and user interface system. According to one implementation of the invention, the Control Module 1200 is part of the Control Unit (FIG. 1, 122), which is 1 U in height. The Control Module 1200 has the board detect feature and separate user module busses 1202, because of this and of software support, the User Modules (FIG. 1, 128) may be hot-swappable to permit expanding the number of User Modules (FIG. 1, 128) in a Control Unit (FIG. 1, 120; FIG. 5, 502) without the need to shut off the Control Unit (FIG. 1, 120; FIG. 5, 502), the Vertical Column and/or the devices in a rack cabinet connected to the Vertical Column.

One implementation of the Control Module 1200 includes a plurality of user card slots or connectors 1202 which permit multiple users to simultaneously access servers via the Control Module 1200. A mix of Local Interface Modules (LIM), Remote Interface Modules (RIM), and User Cascade Interface Module (UCIM) can be plugged into the user card connectors 1202 and provide access to the Midplane Module 118 (FIG. 1) via connector 1204. The Control Module's Control Processors 1218 manages the Midplane via interface 1206 and the User Modules via serial controller 1208. The network processor 1212 provides the network access for the system, it bridges between the external network via 1220 to the User Modules via 1210 and via 1214 to Control Processor 1218. The Control Processor 1218 also extends the management functions to external rack infrastructure such as: fan, intelligent power strip for servers, UPS, etc, all via the serial interfaces 1214. Both the network processor 1212 and the Control Processor 1218 share a data flash storage 1216 to hold all sorts of non-volatile information.

The Control Module 1200 may also include a plurality of connectors and/or interfaces, such as RJ45 connection, a 10/100/1000 Mb link to a network, a 10/100 Mb link for to the system management bus.

Figure 13:
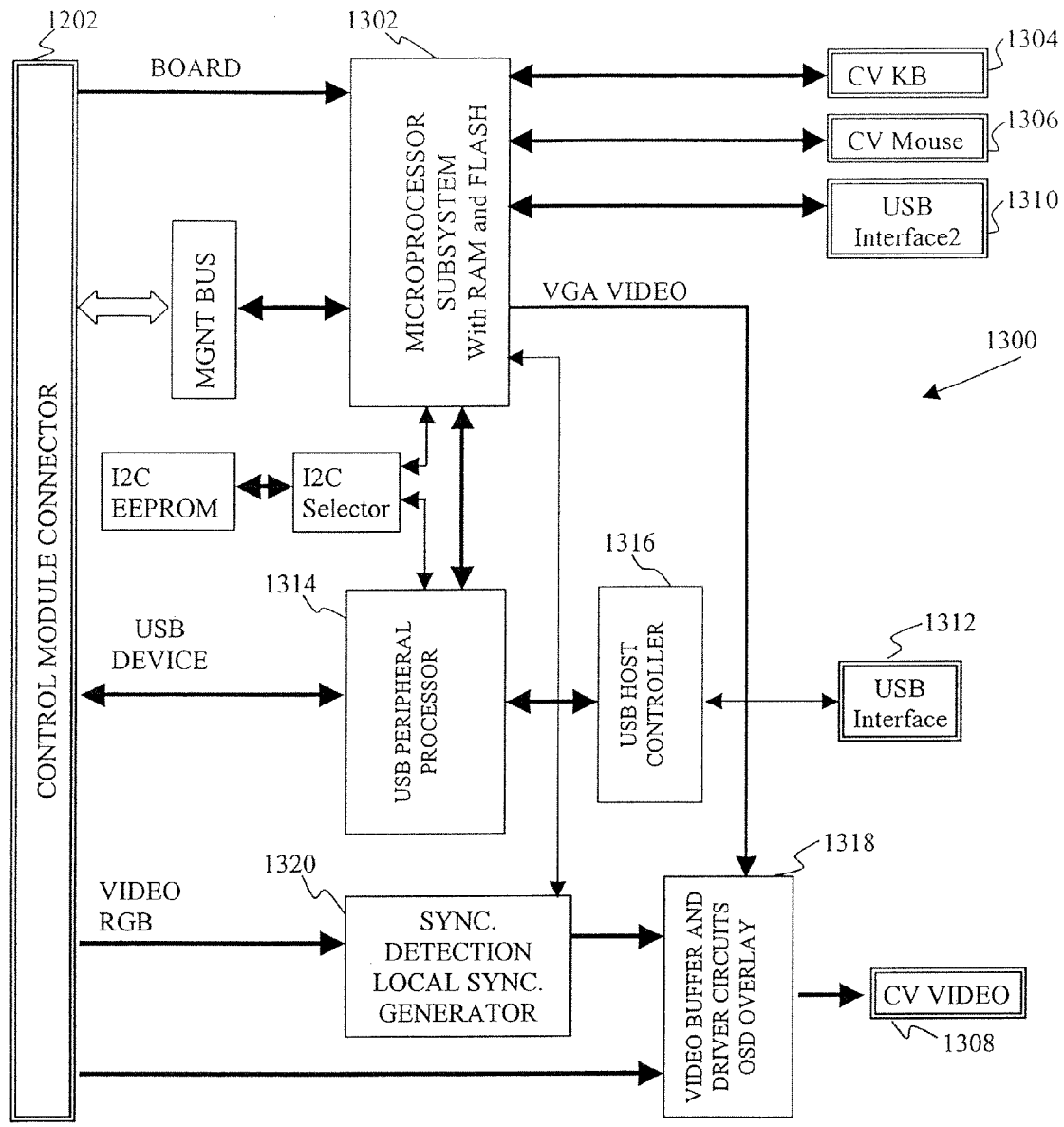
FIG. 13 is a block diagram illustrating a Local Interface Module (LIM) according to one embodiment of the invention.

FIG. 13 is a block diagram illustrating a Local Interface Module (LIM) 1300 according to one embodiment of the invention. The Local Interface Module 1300 is a type of user card that can be plugged into the User Module Connectors 1202 of the Control Module 1200. The Local Interface Module 1300 delivers local access of the servers coupled to the Vertical Column.

According to one implementation of the invention, the Local Interface Module (LIM) 1300 may include a microprocessor subsystem 1302 having a processor and memory. The Local Interface Module 1300 may include one or more interface ports or connectors for a keyboard interface 1304, mouse interface 1306, a video interface 1308, and one or more USB interfaces 1310 and 1312. The keyboard interface 1304, mouse interface 1306 permit a user to provide input to the Local Interface Module while the USB subsystem 1314 and 1316 and interfaces 1310 and 1312 enable USB-compliant devices to be connected to the Local Interface Module 1300. The video subsystem 1318 and 1320 and interface 1308 permits connection of an output device, such as a display unit, where a user may view the applications being executed on the Local Interface Module 1300 as well as access information and/or applications from one or more user-selected servers. For example, the Local Interface Module 1300 may provide an on-screen display that allows a user or operator to navigate the attached systems (Control Unit, Vertical Column, Midplane Module, Backplane Modules, servers, etc).

Used in conjunction with system management software, the Local Interface Module 1300 provides keyboard, video, and mouse access to the Vertical Column and all of the components electrically coupled thereto.

Additionally, the Local Interface Module 1300 may provide a terminal emulator allowing users to manage and configure serial devices such as routers or managed switches. The Local Interface Module 1300 may also support optional USB device sharing. This can be used for peripheral device consolidation and/or biometric security devices.

According to one implementation of the invention, USB device sharing provides the ability to attach a single or several USB peripheral devices to the local management card of the server rack. The servers in the server rack may then have access to the peripheral devices. This permits using a single device, e.g., a CD-ROM, per server rack as opposed to the current trend of integrating a separate device, e.g., a CD-ROM, into each server or computer. In another implementation, card readers and/or biometric readers may be used to provide server authentication. Instead of having a single authentication device per server, or a separate USB switch in each server dedicated to support an external authentication device, the server rack management system can share that authentication or peripheral device (e.g., card reader, biometric reader, etc.) with each connected server. These USB devices would be connected to the Local Interface Module 1300 while the switching through the column would provide a connection to any of the servers connected to the Server Interface Module 1300 in the column.

Figure 14:
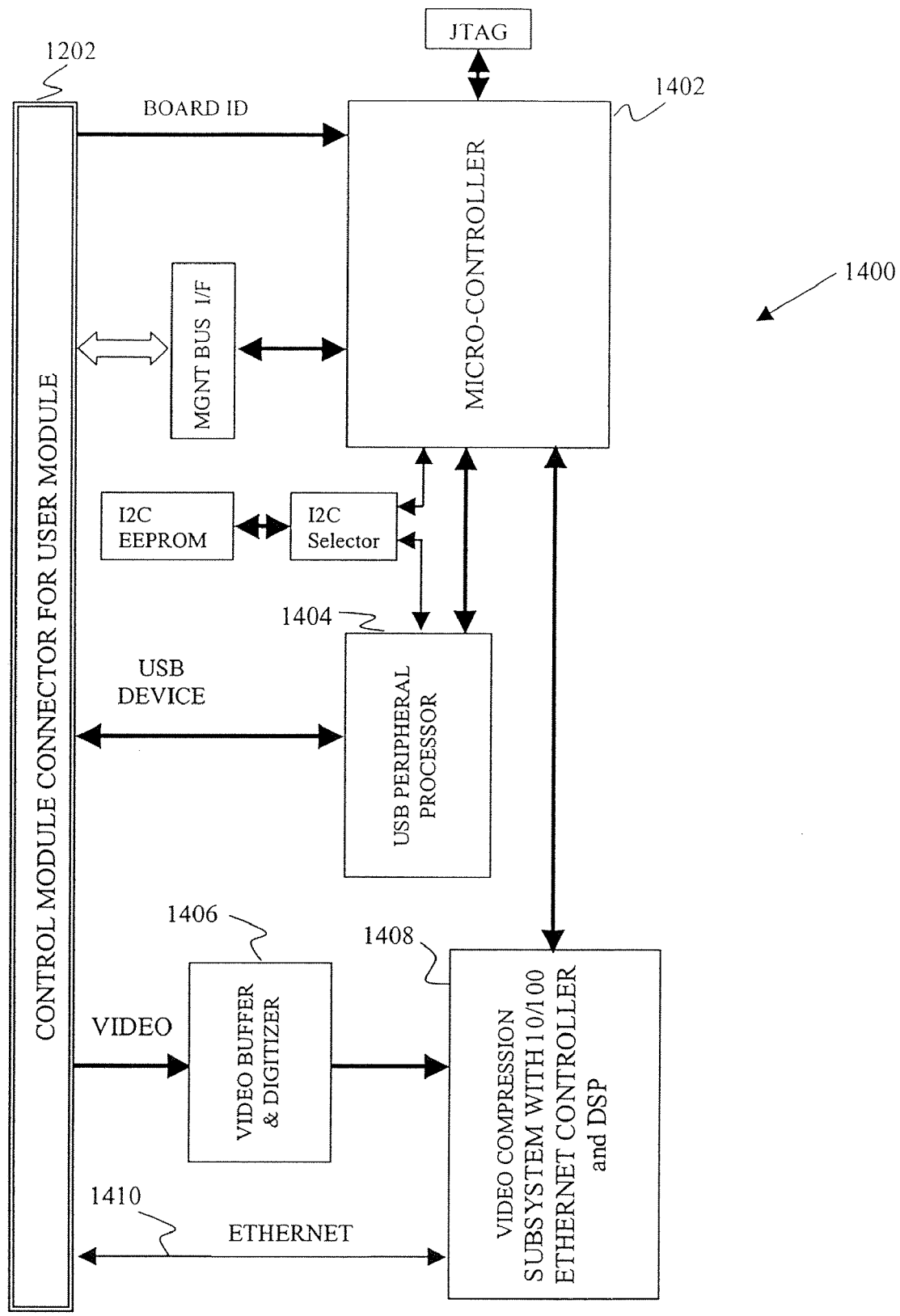
FIG. 14 is a block diagram illustrating Remote Interface Module (RIM) according to one embodiment of the invention.

FIG. 14 is a block diagram illustrating Remote Interface Module (RIM) 1400 according to one embodiment of the invention. A Remote Interface Module 1400 allows a user or operator to navigate the attached systems (e.g., Control Unit, Vertical Column, Midplane Module, Backplane Module, servers, etc.) over an IP network. The Remote Interface Module 1400 is a type of user card that can be plugged into the User Interface Module connectors 1202 of the Control Module 1200. The Remote Interface Module 1400 includes a micro-controller 1402, in conjunction with a USB subsystem 1404 and video subsystem 1406 and 1408, translates the signals from the Control Module interface 1202 into IP packets and transfers the data over the Ethernet interface 1410 to the network port 1220 of the control module 120.

In one implementation of the invention, up to four Remote Interface Module 1400 cards may be installed in a control module to provide a 4×N switch access, where N can typically be forty-two (42). The Remote Interface Module 1400 may digitize video signals and packetize it along with other digital data (e.g., USB and/or management data) into IP packets to be sent to remote locations via the Internet.

Figure 16:
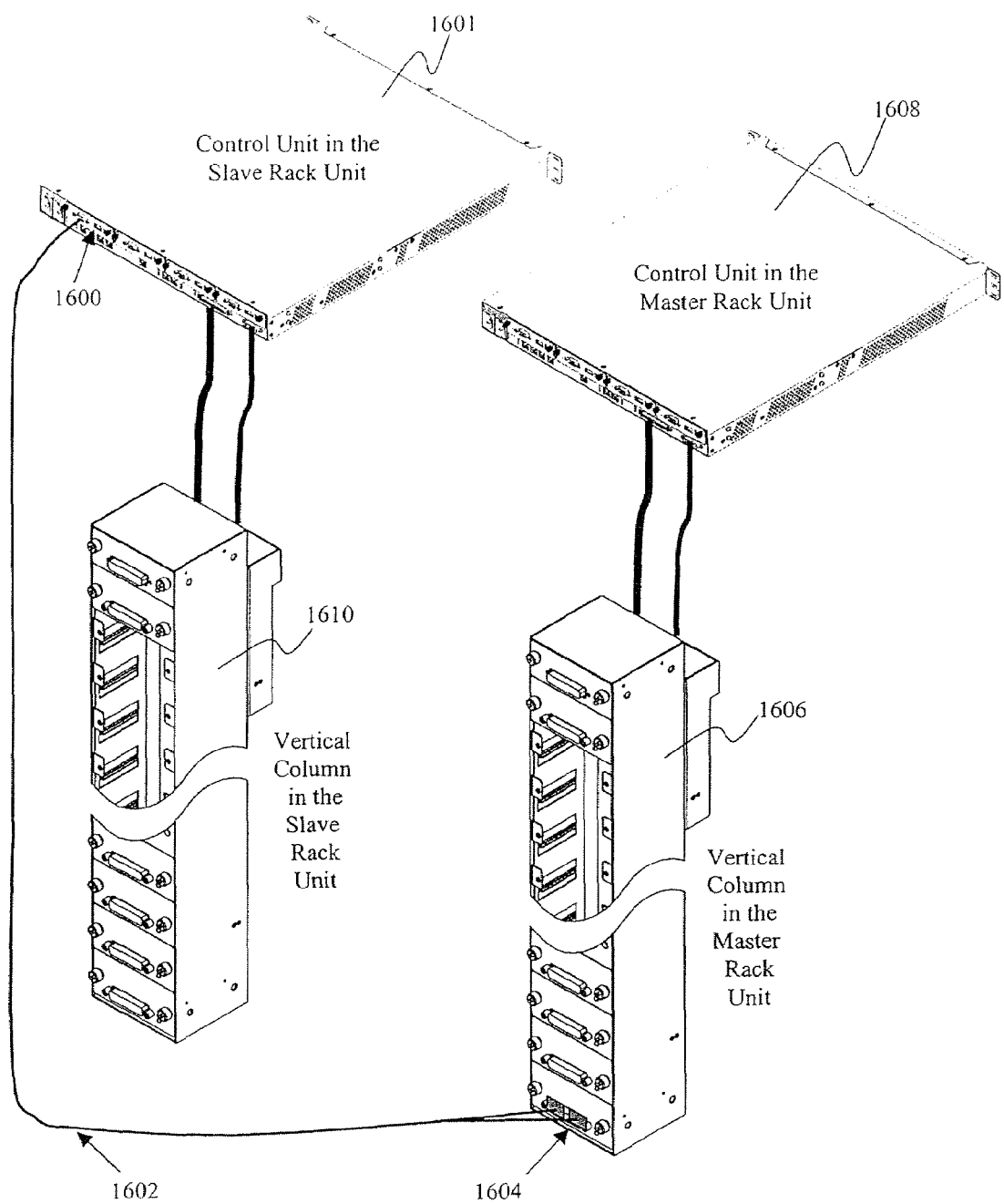
FIG. 16 illustrates one embodiment of a connection arrangement between a slave system cascaded to a master system.

FIG. 15 is a block diagram illustrating User Cascade Interface Module (UCIM) 1500 according to one embodiment of the invention. A UCIM 1500 allows the user or operator in an external master rack unit to navigate the attached slave systems (e.g., Control Unit, Vertical Column, Midplane Module, Backplane Module, servers, etc.) over the cascade cable interconnection (FIG. 16, 1602). The User Cascade Interface Module 1500 is a type of user card that can be plugged into the User Module connectors 1202 of the Control Module 1200. The User Cascade Interface Module 1500 includes a micro-controller 1502, in conjunction with a USB processor 1504 and video receiver/driver 1506, translates the signals from the control module interface 1202 into Data Serializer driver 1508 and the Cascade Connector 1510 and transfers the data over the cascade cable bundle (FIG. 16, 1602). In one implementation of the invention, a Cascade Interface Module (FIG. 15, 1500) is configured to send reconditioned analog video and digital data to an external master rack unit, in a point-to-point communication scheme, to enable a user or operator in the external master rack unit to navigate the attached slave systems.

In one implementation of the invention, up to four User Cascade Interface Module cards (FIG. 15, 1500) may be installed in a slave Control Module (FIG. 1, 120) to provide a 4×N switch access to the master rack unit, where N can typically be forty-two (42). FIG. 16 illustrates one embodiment of a connection arrangement between a slave system cascaded to a master system. The User Cascade Interface Module 1600 in Control Unit 1601 is slaved to a Server Cascade Module (FIG. 16, 1604) in the master Vertical Column 1606, through a cascade cable 1602. In this manner, the Control Unit 1608, located in a first rack unit, may control the equipment and/or servers coupled to Control Unit 1601 and the slave Vertical Column 1610 located in a second rack unit.

Figure 17:
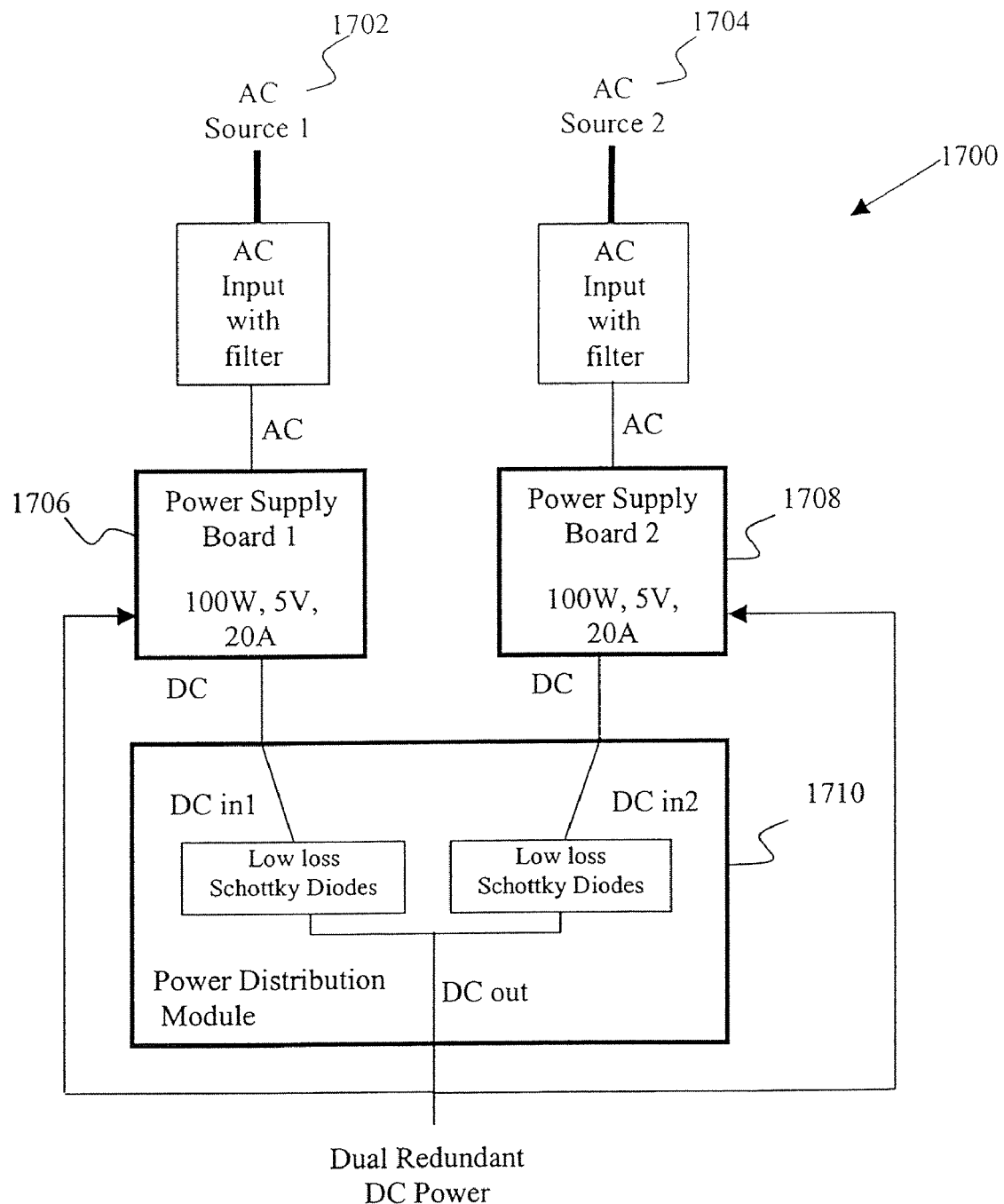
FIG. 17 is a block diagram illustrating a Dual Redundant Power Supply (DRPS) system according to one embodiment of the invention.

FIG. 17 is a block diagram illustrating a Dual Redundant Power Supply (DRPS) system 1400 (illustrated as 126 in FIG.

1) according to one embodiment of the invention. The system is fed with a dual AC input sources 1702 and 1704 into redundant power supplies 1706 and 1708. This allows separate AC feeds 1702 and 1704 to enter the unit 126 providing protection against both a power distribution unit failure and a power supply module failure. In the event of a power supply failure, the Control Unit 122 notifies the user, allowing a scheduled maintenance period to be set. A power distribution module 1710 provides a DC power output from the redundant power supplies 1706 and 1708 feed the control module 120, the Single Board Computer 124, the Vertical Column 102 (FIG. 1), and other devices.

Figure 18:
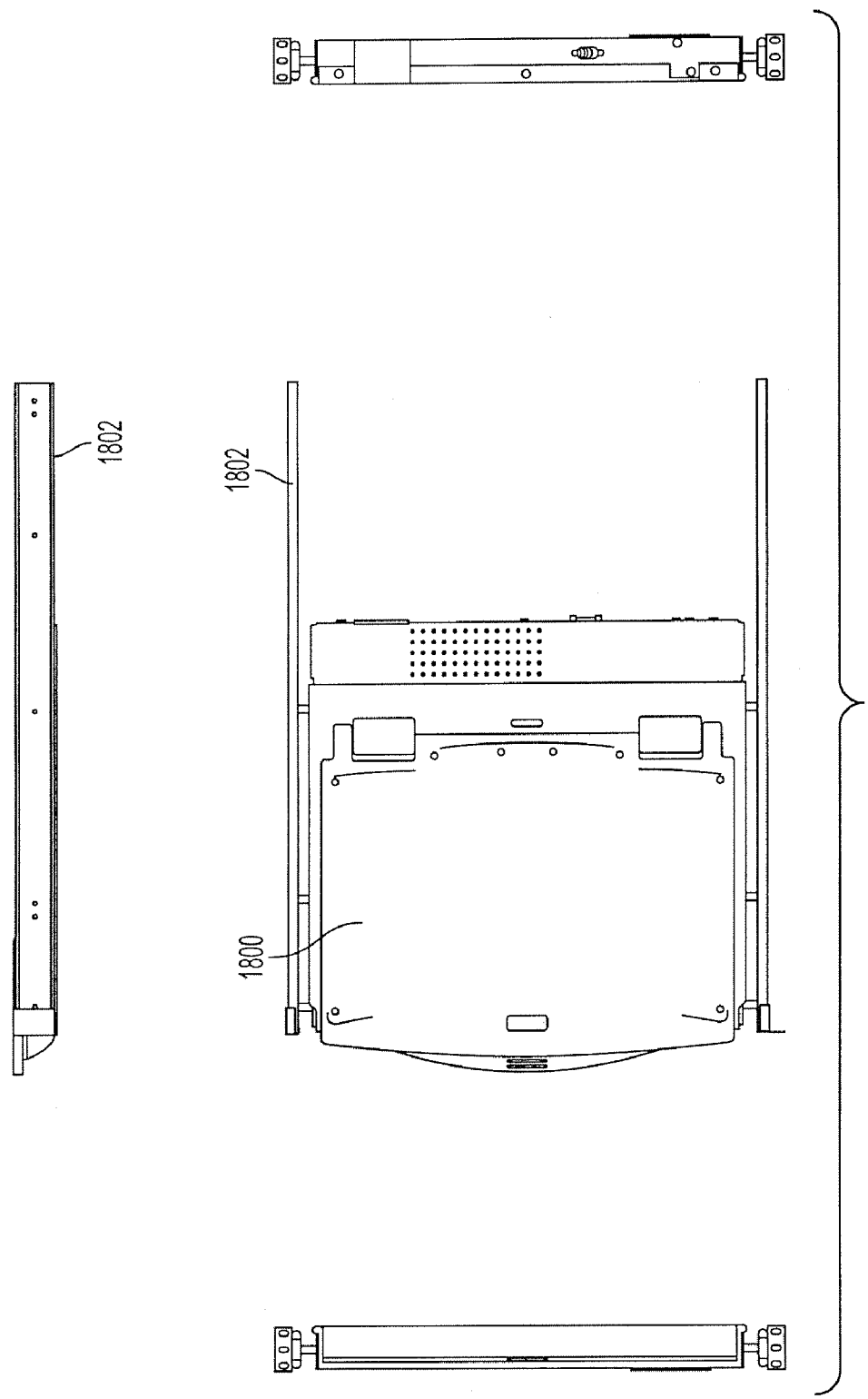
FIGS. 18-20 illustrate a user interface device that enables an operator to access and manage devices communicatively coupled to a Control Unit according to one embodiment of the invention.
Figure 19:
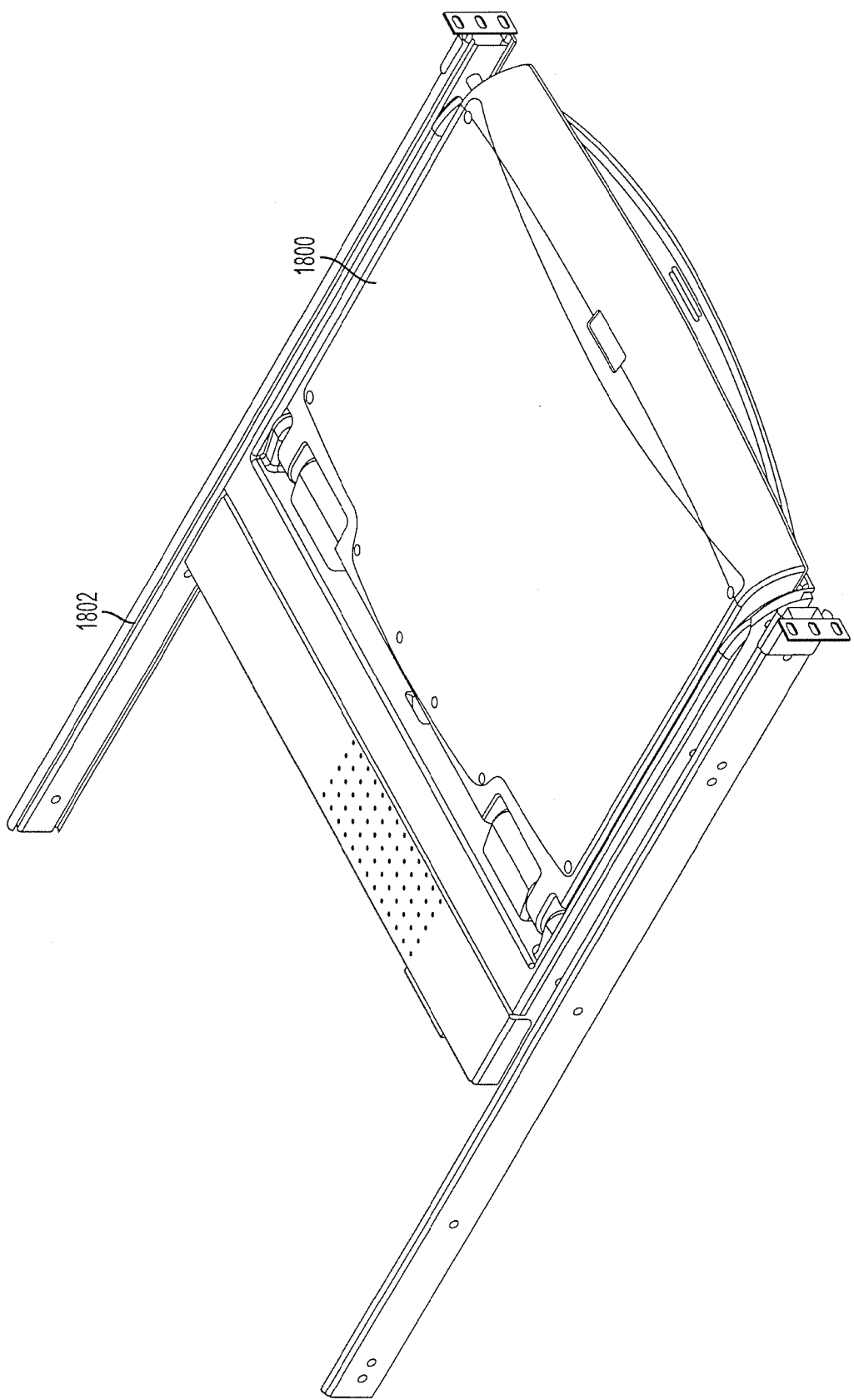
Figure 20:
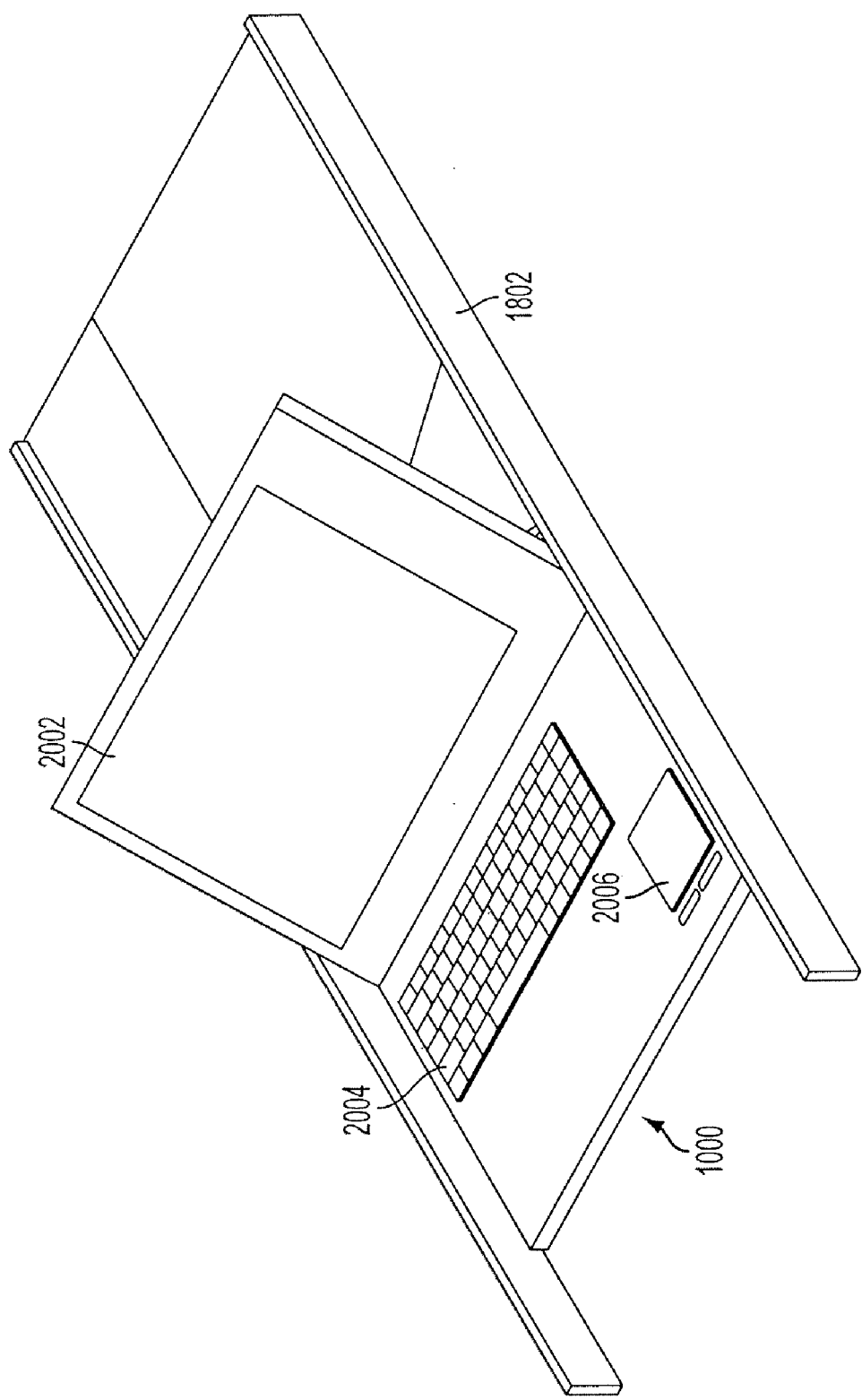

According to one embodiment of the invention, a user interface device is provided that enables an operator to access and manage devices communicatively coupled to the Control Unit 122, including the Single Board Computer 124, Control Module 120, Midplane Module 118, Vertical Column 102, Backplane Modules 106, Server Interface Modules 108, power supplies 126, and servers 114. In one implementation, the user interface device may be IU-high enclosure including a flat panel display unit, a keyboard and a touchpad system that mounts in a standard rack mount cabinet. This system allows for direct connectivity to a Local Interface Module in order to access and manage a system locally. FIGS. 18-20 illustrate a user interface device that enables an operator to access and manage devices communicatively coupled to the Control Unit 122 according to one embodiment of the invention. FIG. 18 illustrates the top and side views of the user interface device 1800. The dimensions of the user interface device 1800 are such that, in one position, it fits within a single U space of a rack unit. The user interface device 1800 may be coupled to rails 1802 that permit the user interface device 1800 to slide in and out of the rack unit. FIG. 19 illustrates a perspective view of the user interface device 1800 in a closed position. FIG. 20 illustrates a second perspective view of the user interface device 1800 in an open position. The user interface device 1800 may include a display unit 2002, a keyboard 2004, and a pointing device 2006 to permit a user to operate software programs that provide control over other rack mounted devices.

According to various embodiments of the invention, one or more user interfaces device 1800 may be mounted in one or more rack cabinets to permit users to access equipment and/or servers in a plurality of networked rack cabinets. For instance, a single user interface 1800 may enable first user to access a first set of servers in one or more rack cabinets while enabling a second user to access a second set of server in one or more rack cabinets.

In yet another implementation of the invention, a user may remotely access, control, and/or monitor equipment and/or servers in one or more rack cabinets. For example, using network interface 140, a user may access a control unit 122 from which local and networked servers in one or more rack cabinets may be controlled, monitored, and/or accessed.

Another feature of the invention provides an application that may be executed on a remote terminal to access on or more systems in a rack unit (e.g. Single Board Computer, Control Module, Midplane Module, Backplane Module, Server Interface Module, or servers) over an IP based network. One feature of the application allows a user to log onto the system and authenticate across the network's Active Directory (AD) to determine to what devices the user may have management access and/or read-only access. The application may provide a graphical user interface of the management system and allow for key sequences to be sent to the remotely connected systems.

Yet another feature of the invention provides centralization of security management. Typically, each portion of rack management (e.g., server, power and environment management) has its own passwords and security settings. One embodiment of the present invention provides centralized security back to the network's Active Directory (AD). The AD determines what access level a user has to manage particular devices within a data center, a rack or even a component within the device. This centralized security system eliminates the need for separate security schemes for each portion of the system (e.g., server, power and environment management). Such centralized security leverages the use of a data center's existing security control server, sometimes also called security domain controller. In other embodiment of the invention when the centralized security server is not available, the Control Module hosts its own security authentication for access to the server management.

Yet another feature of the invention provides for other components that extend the capabilities of the rack management system.

For instance, one embodiment of the invention may include a top-level application that manages multiple rack units. Such system may operate on an embedded Microsoft Windows™ operating system. The top-level application may gather and provide performance metrics and scripts to be managed and distributed to the devices throughout the attached rack.

Another aspect of the invention provides a distributed patch panel in which a 40 U bracket attaches to the vertical column and terminates up to three RJ45 jacks/ports per rack U allowing for the integration of distributed data patch cables. The top of the vertical column may terminate at a switch or other network device located in the top of the rack.

According to another embodiment of the invention, a vertical cable management tray can be added to the system in place of the distributed patch panel. This enables the organized vertical routing of any additional cables not directly handled by the invention.

Another embodiment of the invention provides high-density power distribution units (PDUs) in order to distribute the power evenly throughout the rack unit and minimize power cabling. Each Power Distribution Unit attaches to the Control Module through one or more serial ports. The Control Module can then control the Power Distribution and/or read its metering statistics. As an option the Power Distribution Unit will have the ability to recycle power on a per port basis via the RS-232 ports of the Control Unit.

Another aspect of the invention provides for power metering of total current draw. This data in combination with the server's utilization statistics may be used to determine where power costs can be reduced in a data center.

Another feature of the scalable rack cabinet is that the Vertical Column can be scaled to 14 U columns, 28 U columns, or more as needed. This is accomplished by providing modules (e.g., Backplane Modules, Server Interface Modules, etc.) that can be added to the Vertical Column as necessary. The system management software may be configured to permit the use of a different number of modules along the system.

The management software may also be configured to gather data sets, allowing for an overall map of a data center to be created. This allows for analysis of open rack areas and finding servers through the use of various metrics. The data may be mapped into a system mapping software package in order to provide elevation charts of the installation.

The rack architecture provides the hardware baseline to allow servers to become generic processing units. Servers are typically deployed with specific tasks, such as web serving or database functions. If access to a server is low, the server continues to run in a static state consuming power and generating heat. This methodology has led to processor utilization figures that are in the single digits for most all data centers. The increased need for computing has led to increased density, which in turn has presented the issue of providing sufficient cooling and power to the servers in a data center. The idea of using fewer computers more wisely has not been practical since there was not an efficient way of monitoring processing loads and controlling a plurality of servers.

According to one embodiment of the present invention, the centralized control of servers within a server rack combined with a robust software platform permits managing a pool of storage devices, networking devices and servers. This centralized management tool allows an operator to run a data center based on a predetermined best practices methodology or tweak the utilization thresholds to meet the requirements of a more customized installation. For example, if a mail server was operating at five percent (5%) capacity between the hours of nine (9) PM to six (6) AM the management system may direct that activity to another server and sequentially power down the underutilized or stagnant server. When capacity is required, the system may be brought up and made available to share the load. This eliminates wasted energy in both cooling and powering of the equipment. Additionally, such intelligent system management eliminates the need for expensive load balancing systems since the feedback loop has been migrated to the device manager as opposed to the network exclusively. The "feedback loop" refers to the intelligent sampling and the application of the appropriate corrective action. If this feedback is handled on the network exclusively, decisions are made based solely on network traffic and network transaction data. Such network-based decisions ignore important factors such as the operating environment, power consumption, and processor utilization.

With the ability to collect data such as processor speed, memory capacity, port capacity and hard drive capacity etc. the system can build a record of the complete rack environment based on the data gathered and applying rules programmed into the Single Board Computer 124. This allows a server rack system to provision itself of the equipment therein (e.g., servers, storage, etc.) based on simple commands provided by the operator and build a stable and secure software environment with minimal human intervention.

In one implementation of the invention, by maintaining configuration and provisioning information about resources in a server rack and/or data center, an operator can actively control the migration of programs, data or responsibilities of the equipment, thus making hardware upgrades significantly simpler.

According to one implementation of the invention, a metering feature of the management system provides constant data gathering and analysis in order to predict failures of components or systems. Upon an alert, a human operator can be notified and/or measures can be automatically taken based on the rules programmed into the Single Board Computer 124. This data can be used to judge the relative useful life remaining on components or provide a financial analysis on the benefits of upgrading to more current technology. In essence, metering analysis takes the guesswork out of information technology infrastructure capacity planning.

Since the management system is capable of gathering physical location and contents/configuration of each attached device, it can be instrumental in asset management. A top level program can gather desired elements of data from each server rack within a data center or company and provide a detailed inventory on assets and physical locations. This information is also useful in planning optimal deployment areas within a data center.

According to one implementation of the invention, the management system may also be employed in network load generation. Typically, if a server has become saturated the network will continue to broadcast and route packets to a particular resource (e.g., server). However, according to one implementation of the invention, a resource (e.g., server) reports back to the centralized management system that it has reached a threshold level of utilization, e.g., 85% capacity. The management system may then send a command to a router to scale back the broadcasting or shift the resource to a different device. This helps reduce networking traffic and maximizes total system performance. The centralized management architecture permits using available hardware for load shifting by providing a communication and reporting loop to monitor loads and usage metrics.

Another feature of the invention provides for centralizing the management of the devices within a rack cabinet (e.g., server, network equipment, power and environmental equipment, etc.). According to one implementation of the invention, each rack cabinet is associated with a particular identifier. For instance, the control module in a rack cabinet may be associated with a unique Internet Protocol (IP) address within a data center. This IP address permits identifying the location of a device within a data center. Additionally, an operator can remotely access a device over a network by using the IP address of the rack cabinet in which the device resides and accessing the device list for that rack cabinet. This IP address provides access to both IP based third party products as well as serial based third party products. In essence the IP address is a gateway to all management devices within the rack cabinet.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications are possible. Those skilled, in the art will appreciate that various adaptations and modifications of the just described preferred embodiment can be configured without departing from the scope and spirit of the invention. Additionally, it is possible to implement embodiments of the invention or some of their features in hardware, programmable devices, firmware, software or a combination thereof. The invention or parts of the invention may also be embodied in a processor-readable storage medium or machine-readable medium such as a magnetic (e.g., hard drive, floppy drive), optical (e.g., compact disk, digital versatile disk, etc), or semiconductor storage medium (volatile and non-volatile). Therefore, it is to be understood that, within the scope of the appended claims, the invention may be practiced other than as specifically described herein.

What is claimed is:

1. A rack comprising:
    a frame to house one or more electrical devices;
    an interface unit attached to the frame, the interface unit comprising a bus communicatively coupled to one or more interfaces;
    a midplane module communicatively coupled to the bus in the interface unit for concentrating access to the one or more electrical devices coupled to the one or more interfaces, wherein the midplane module is communicatively coupled to the one or more interfaces;

a cable communicatively coupling one of the electrical devices to one of the interfaces in the interface unit, the cable carrying a plurality of signals; and a control module communicatively coupled to the bus in the interface unit to control the one or more electrical devices.

2. The rack of claim 1 wherein the control module provides keyboard, video, and mouse access to the one or more electrical devices.

3. The rack of claim 1 wherein the control module provides centralization security access to the electrical devices.

4. The rack of claim 1 wherein the control module is further configured to remotely control one or more electrical devices coupled to an interface unit of another rack.

5. The rack of claim 1 wherein the cable has a connector at a first end to connect to an interface in the interface unit and a plurality of connectors at a second end to connect to one of the electrical devices.

6. The rack of claim 5 wherein the first end of the cable has a 25-pin connector that supports the connectors at the second end.

7. The rack of claim 1 wherein the cable carries a plurality of signals including one or more signals from a group comprising keyboard, video, mouse, universal serial bus (USB), and serial port signals.

8. The rack of claim 1 wherein the interface unit and the cable reduce the number of separate cables in the rack.

9. A rack comprising:
an enclosure to mount one or more electrical devices;
an interface unit attached to the enclosure, the interface unit including one or more interfaces and a bus connected to the one or more interfaces;
a midplane module connected to the bus in the interface unit for concentrating access to the one or more electrical devices, wherein the midplane module is connected to the one or more interfaces;
an interface module connected to one of the interfaces in the interface unit, the interface module providing access to one of the electrical devices; and
a cable connecting one of the electrical devices mounted in the enclosure to the interface module, the cable carrying a plurality of signals.

10. The rack of claim 9 wherein the cable has a connector at a first end to connect to an interface in the interface unit and a plurality of connectors at a second end to connect to one of the electrical devices.

11. The rack of claim 9 wherein the cable carries a plurality of signals including one or more signals from a group comprising keyboard, video, mouse, universal serial bus (USB), and serial port signals.

12. The rack of claim 10 wherein the first end of the cable has a 25-pin connector that supports the connectors at the second end.

13. The rack of claim 9 wherein the interface unit and the cable reduce the number of separate cables in the rack.

14. An apparatus comprising:
a control module, the control module including a first interface to communicate with one or more electronic devices coupled to an interface column, the interface column comprising a bus communicatively coupled to one or more interfaces;
a midplane module communicatively coupled to the bus in the interface column for concentrating access to the one or more electrical devices coupled to the one or more interfaces, wherein the midplane module is communicatively coupled to the one or more interfaces;
a computing device communicatively coupled to the control module, the computing device configured to
control one or more of the electronic devices over the first interface, maintain an inventory of those devices coupled to the interface column and recognize when electrical devices have been added, and
provide centralization security access to the electrical devices, and collect and analyze usage of the electrical devices for proper preventive maintenance and provisioning of the electrical devices.

15. The apparatus of claim 14 where the control module provides keyboard and video access to the one or more electronic devices.

16. The apparatus of claim 14 wherein the control module provides mouse, serial port, and universal serial bus access to the one or more electronic devices.

17. The apparatus of claim 14 wherein the control module permits electrical devices coupled to the interface column to share a peripheral device.

18. A rack comprising:
an interface unit comprising a bus communicatively coupled to a plurality of interfaces communicatively coupled to one or more electronic devices;
a midplane module communicatively coupled to the bus in the interface unit for concentrating access to the one or more electrical devices coupled to the one or more interfaces, wherein the midplane module is communicatively coupled to the one or more interfaces;
a control module communicatively coupled to the interface unit, the control module comprising one or more interface modules; and
a user interface device communicatively coupled to the control module, the user interface device enabling an operator to access and manage one or more electronic devices.

19. The rack of claim 18 wherein the control module comprises hot-swappable interface modules.

20. The rack of claim 18 wherein the control module comprises a local interface module that enables the control module to control the one or more electronic devices communicatively coupled to the interface unit.

21. The rack of claim 18 wherein the control module comprises a remote interface module that enables the control module to control the one or more electronic devices communicatively coupled to the interface unit remotely through a network.

22. The rack of claim 18 wherein the control module comprises a user cascade interface module that enables the control module to control one or more electronic devices communicatively coupled to a second interface unit coupled to a second rack.

23. The rack of claim 18 wherein the user interface device comprises a display unit, a keyboard, and a pointing device.

24. The rack of claim 18 further comprising a server cascade interface module that enables servers to be hot-swappable.

25. The rack of claim 18 wherein the control module permits electrical devices coupled to the interface column to share a peripheral device.

* * * * *